(12) United States Patent
Matsumoto

(10) Patent No.: US 11,043,525 B2
(45) Date of Patent: Jun. 22, 2021

(54) TRANSMISSION CIRCUIT AND ELECTRONIC DEVICE

(71) Applicant: CANON KABUSHIKI KAISHA, Tokyo (JP)

(72) Inventor: Shoji Matsumoto, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/559,180

(22) Filed: Sep. 3, 2019

(65) Prior Publication Data
US 2020/0098816 A1    Mar. 26, 2020

(30) Foreign Application Priority Data

Sep. 21, 2018  (JP) .............................. JP2018-178130

(51) Int. Cl.
*H01L 27/146*  (2006.01)
*H01L 23/66*  (2006.01)
(Continued)

(52) U.S. Cl.
CPC ........ *H01L 27/14636* (2013.01); *H01L 23/66* (2013.01); *H01L 27/14618* (2013.01);
(Continued)

(58) Field of Classification Search
CPC ......... H01L 27/14636; H01L 27/14627; H01L 27/14634; H01L 33/36; H01L 2223/6638;
(Continued)

(56) References Cited

U.S. PATENT DOCUMENTS 7,564,695 B2   7/2009   Matsumoto
7,595,546 B2   9/2009   Matsumoto
(Continued)

FOREIGN PATENT DOCUMENTS

EP    2402959       1/2012
JP    2003-100156 A 4/2003
(Continued)

OTHER PUBLICATIONS

European Search Report dated Feb. 21, 2020 issued in counterpart European application No. 19194275.4.
(Continued)

*Primary Examiner* — Thinh T Nguyen
(74) *Attorney, Agent, or Firm* — Venable LLP

(57) ABSTRACT

A transmission circuit includes a first semiconductor device, a second semiconductor device, a first signal line, a second signal line, a third signal line, and a ground line. A differential signal is composed of a first signal and a second signal. The first signal line is configured to connect the first semiconductor device and the second semiconductor device and used to transmit the first signal. The second signal line is configured to connect the first semiconductor device and the second semiconductor device and used to transmit the second signal. The second signal line, the first signal line, the ground line, and the third signal line are disposed in this order. A distance between the first signal line and the ground line is larger than a distance between the first signal line and the second signal line.

20 Claims, 11 Drawing Sheets

(51) Int. Cl.
*H05K 1/14* (2006.01)
*H01P 3/06* (2006.01)
*H05K 1/02* (2006.01)
*H05K 1/18* (2006.01)

(52) U.S. Cl.
CPC .. *H01L 27/14627* (2013.01); *H01L 27/14634* (2013.01); *H01P 3/06* (2013.01); *H05K 1/0277* (2013.01); *H05K 1/14* (2013.01); *H05K 1/181* (2013.01); *H01L 2223/6627* (2013.01); *H01L 2223/6638* (2013.01)

(58) Field of Classification Search
CPC ........ H01P 3/06; H05K 1/181; H05K 1/0277; H05K 1/14
USPC .................................. 257/662, 663, 664, 259
See application file for complete search history.

(56) References Cited

U.S. PATENT DOCUMENTS

| | | | |
|---|---|---|---|
| 8,428,155 B2 | 4/2013 | Matsumoto | |
| 9,192,044 B2 | 11/2015 | Hayashi | |
| 10,306,761 B2 | 5/2019 | Numagi | |
| 2006/0067066 A1* | 3/2006 | Meier et al. | H05K 1/14 361/785 |
| 2008/0236868 A1 | 10/2008 | Koga | |
| 2009/0224798 A1 | 9/2009 | Yamaguchi | |
| 2010/0184307 A1 | 7/2010 | Arai | |
| 2013/0252445 A1 | 9/2013 | Barr | |
| 2014/0034363 A1 | 2/2014 | Biddle | |
| 2018/0088386 A1 | 3/2018 | Enami | |
| 2019/0246498 A1 | 8/2019 | Numagi | |

FOREIGN PATENT DOCUMENTS

| | | |
|---|---|---|
| JP | 2010-92805 | 4/2010 |
| JP | 2010-143211 | 7/2010 |
| JP | 2015-82049 | 4/2015 |
| JP | 2017-59517 A | 3/2017 |

OTHER PUBLICATIONS

Japanese Search Report dated Apr. 6. 2021 in corresponding Japanese Application No. 2018-178130 (Translation included).

* cited by examiner

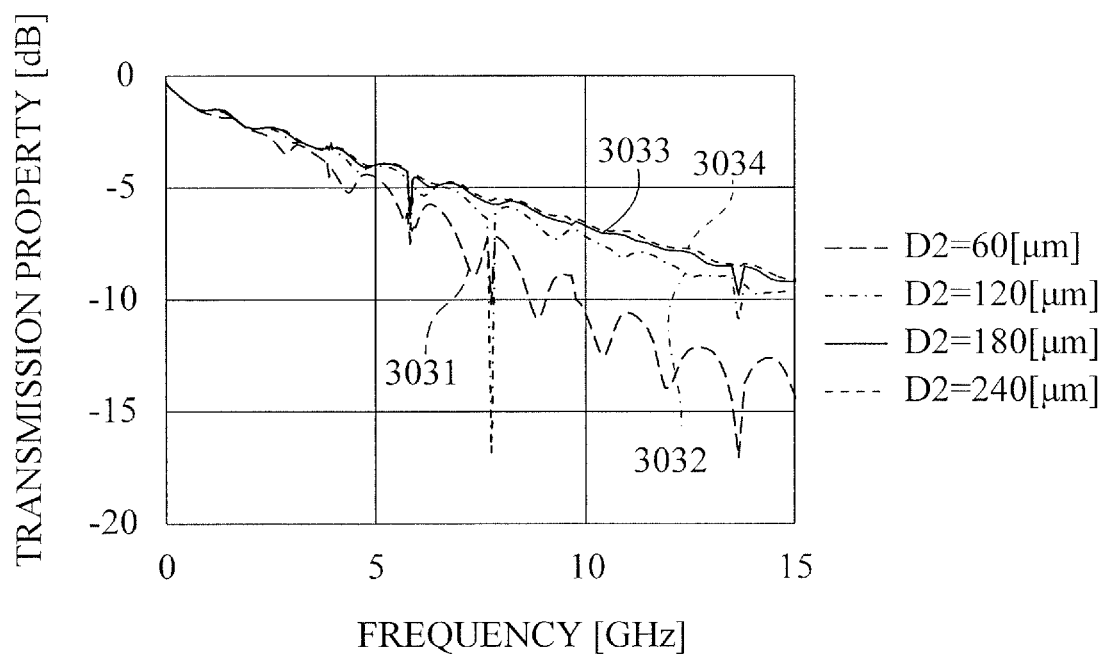
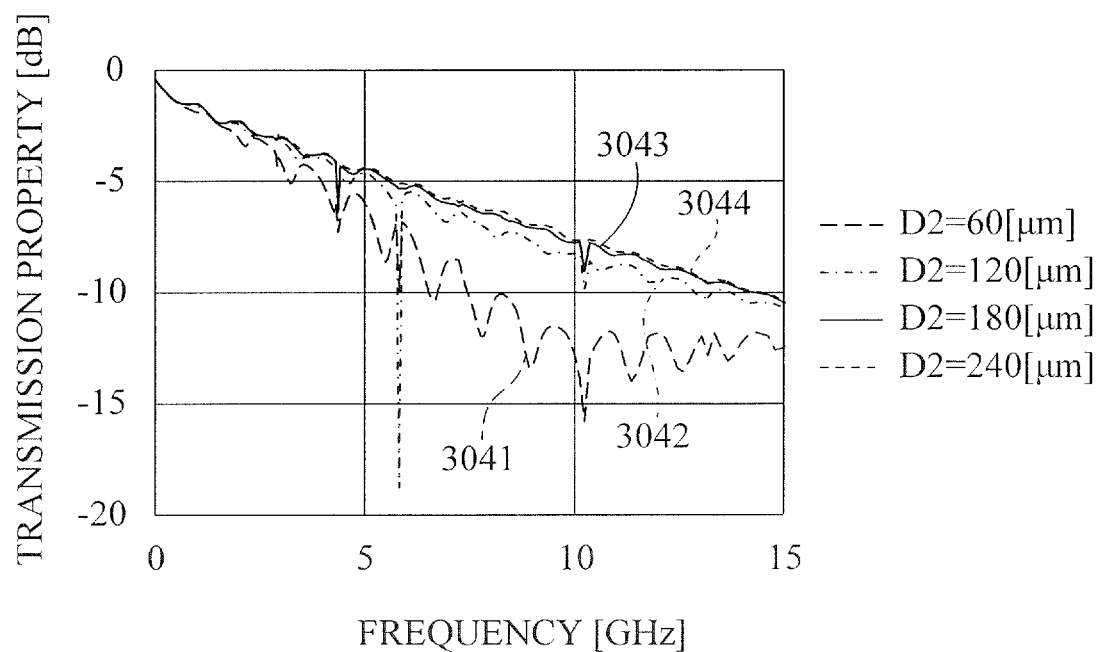

TRANSMISSION CIRCUIT AND ELECTRONIC DEVICE

BACKGROUND OF THE INVENTION

Field of the Invention

The present invention relates to a transmission circuit via which two semiconductor devices communicate with each other, and to an electronic device.

Description of the Related Art

Two semiconductor devices of an electronic device perform data communication with each other. The electrical signal used for the communication between the two semiconductor devices is digital signal. The electrical signal is transmitted via signal lines. Japanese Patent Application Publication No. 2015-82049 proposes a configuration in which signal lines are formed in a flexible wiring board for easily (flexibly) arranging the signal lines in an electronic device (and for reducing the weight of the electronic device).

In the communication between two semiconductor devices, signal lines through which differential signals are transmitted and a signal line through which a single-ended signal is transmitted are both used. In high-speed data communication, differential signals are mainly used. In recent years, differential signals have been increasing in speed and decreasing in amplitude, compared to single-ended signals, for transmitting large amounts of data. However, the differential signals are more easily affected by noise. In particular, crosstalk noise introduced to signal lines through which differential signals are transmitted is a problem. If the crosstalk noise is added to the differential signals, the quality of the differential signals will deteriorate.

An object of the present invention is to keep high quality of the differential signals.

SUMMARY OF THE INVENTION

According to one aspect of the present invention, a transmission circuit includes a first semiconductor device configured to receive and/or send a differential signal and a single-ended signal, the differential signal being composed of a first signal and a second signal, a second semiconductor device configured to receive and/or send the differential signal and the single-ended signal, a first signal line configured to connect the first semiconductor device and the second semiconductor device and used to transmit the first signal, a second signal line configured to connect the first semiconductor device and the second semiconductor device and used to transmit the second signal, a third signal line configured to connect the first semiconductor device and the second semiconductor device and used to transmit the single-ended signal, and a ground line. The first signal line, the second signal line, the third signal line, and the ground line are disposed in order of the second signal line, the first signal line, the ground line, and the third signal line. A distance between the first signal line and the ground line is larger than a distance between the first signal line and the second signal line.

Further features of the present invention will become apparent from the following description of exemplary embodiments with reference to the attached drawings.

BRIEF DESCRIPTION OF THE DRAWINGS

FIG. 4A is a graph of a simulation result obtained in the first embodiment.

FIG. 4B is a graph of a simulation result obtained in the first embodiment.

DESCRIPTION OF THE EMBODIMENTS

First Embodiment

Figure 1:
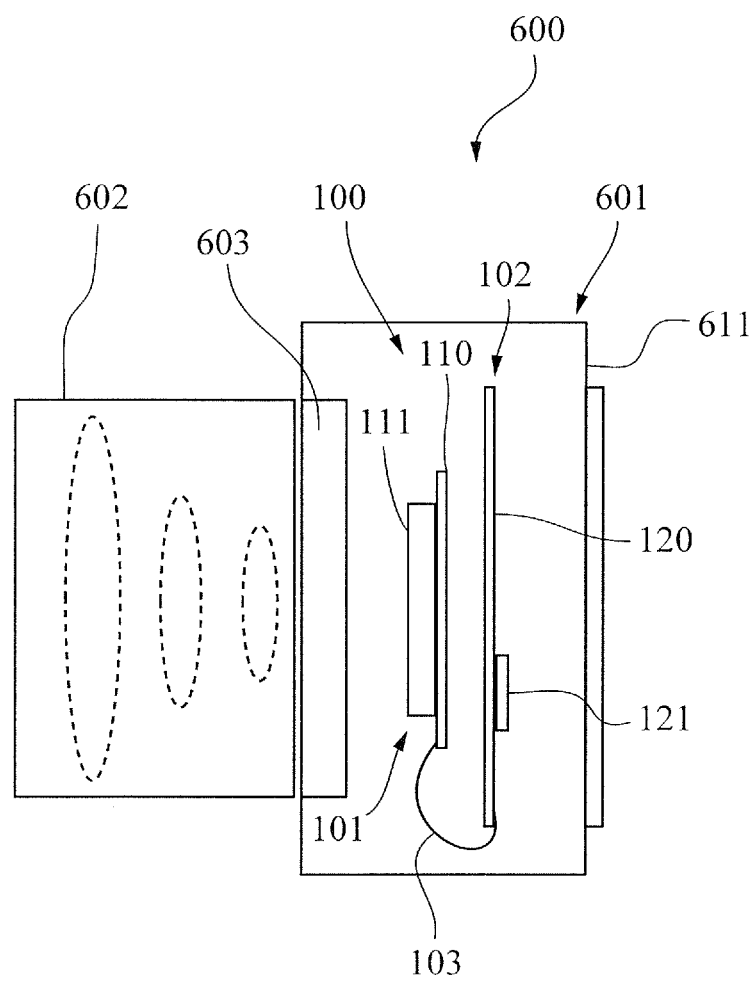
FIG. 1 is a diagram illustrating a digital camera that is an image pickup device as one example of electronic devices of a first embodiment.

Hereinafter, some embodiments of the present invention will be described with reference to the accompanying drawings. FIG. 1 is a diagram illustrating a digital camera 600 that is an image pickup device as one example of electronic devices of a first embodiment. The digital camera 600, which is an image pickup device, is a digital camera with interchangeable lenses; and includes a camera body 601. The camera body 601 includes an attachment-and-detachment portion 603 to which a lens unit (lens barrel) 602 can be detachably attached. That is, the lens unit (lens barrel) 602 that includes lenses can be detachably attached to the camera body 601 by attaching the lens unit 602 to the attachment-and-detachment portion 603. The camera body 601 also includes a housing 611 and an image pickup unit 100 housed in the housing 611. The image pickup unit 100 is one example of transmission circuits.

The image pickup unit 100 includes a printed circuit board 101, a printed circuit board 102, and a single flexible wiring board 103 that electrically connects the printed circuit boards 101 and 102. The flexible wiring board 103 allows the weight of the wiring structure to be lower than the weight of a wiring structure including coaxial cables.

The printed circuit board 101 includes a printed wiring board 110 and a semiconductor device 111 mounted on the printed wiring board 110. The semiconductor device 111 is a first semiconductor device. The printed circuit board 102 includes a printed wiring board 120 and a semiconductor device 121 mounted on the printed wiring board 120. The semiconductor device 121 is a second semiconductor device.

The semiconductor device 111 is an image sensor serving as an image pickup element. The image sensor may be a complementary metal oxide semiconductor (CMOS) image sensor or a charge coupled device (CCD) image sensor. The image sensor has a function to convert the light incident through the lens unit 602, to an electrical signal. The semiconductor device 121 is a digital signal processor serving as a processing circuit. The digital signal processor has a function to receive the electrical signal (representing image data) from the image sensor, correct the electrical signal, and create corrected image data.

The semiconductor device 111, which is the first semiconductor device, is disposed in the camera body 601, closer to the attachment-and-detachment portion 603 than the semiconductor device 121, which is the second semiconductor device.

Figure 2A:
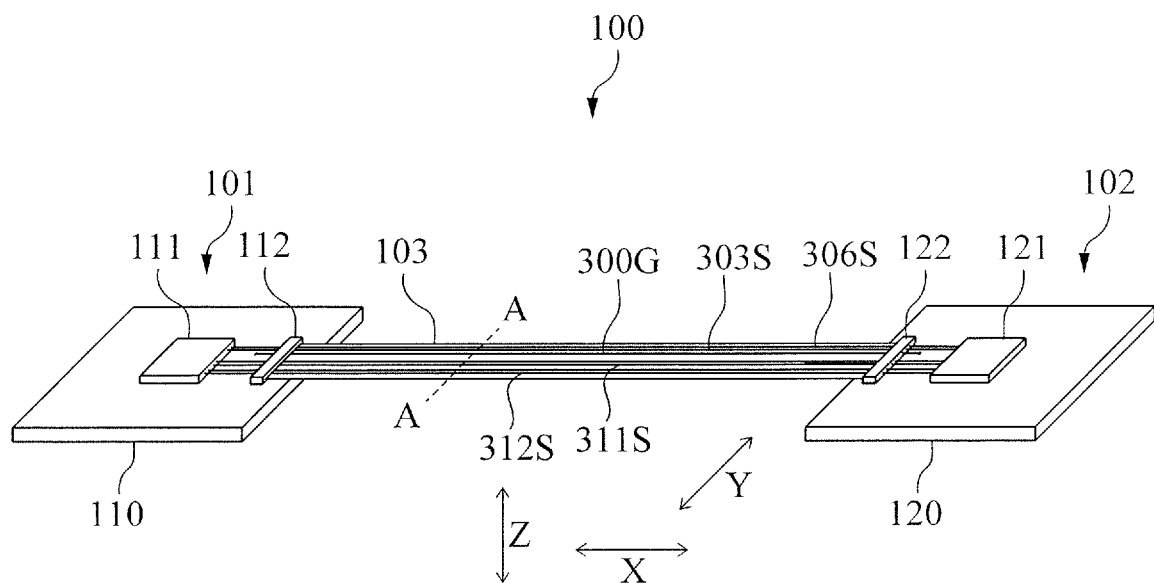
FIG. 2A is a diagram illustrating an image pickup unit that is one example of transmission circuits of the first embodiment.
Figure 2B:
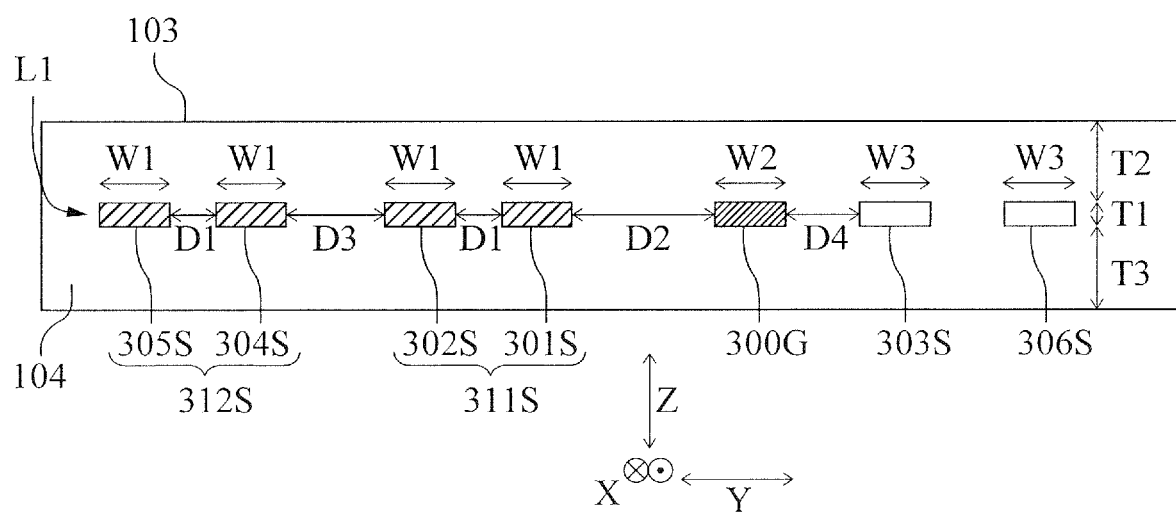
FIG. 2B is a cross-sectional view of a flexible wiring board of the first embodiment.

FIG. 2A is a diagram illustrating the image pickup unit 100 that is one example of transmission circuits of the first embodiment. FIG. 2B is a cross-sectional view of the flexible wiring board 103, taken along a line A-A.

As illustrated in FIG. 2A, a connector 112 is mounted on the printed wiring board 110. The connector 112 connects lines of the flexible wiring board 103 and conductors formed on the printed wiring board 110. The lines of the flexible wiring board 103 are electrically connected to the semiconductor device 111 via the connector 112. In addition, a connector 122 is mounted on the printed wiring board 120. The connector 122 connects the lines of the flexible wiring board 103 and conductors formed on the printed wiring board 120. The lines of the flexible wiring board 103 are electrically connected to the semiconductor device 121 via the connector 122.

As illustrated in FIG. 2B, the flexible wiring board 103 is a single-layer substrate having a single conductor layer. Thus, the flexible wiring board 103 is made thinner and highly flexible. Consequently, the flexible wiring board 103 can be easily arranged in the housing 611, allowing the digital camera 600 to be thinner and lightened. The flexible wiring board 103 includes a plurality of lines 300G, 301S, 302S, 303S, 304S, 305S, and 306S. The lines are disposed in an identical conductor layer L1, with adjacent lines separated from each other in a width direction Y; and extend in a wiring direction X orthogonal to the width direction Y. The lines 300G, 301S, 302S, 303S, 304S, 305S, and 306S are conductor patterns disposed in the conductor layer L1. The material of the lines 300G, 301S, 302S, 303S, 304S, 305S, and 306S may be copper. The flexible wiring board 103 also includes a dielectric 104 that holds the lines 300G, 301S, 302S, 303S, 304S, 305S, and 306S. The material of the dielectric 104 may be polyimide or polyester. Although the plurality of lines 300G, 301S, 302S, 303S, 304S, 305S, and 306S are disposed in the identical conductor layer L1, two adjacent lines of the plurality of lines may slightly deviate from each other in a thickness direction Z. That is, when two adjacent lines deviate from each other, the allowable range of deviation is below the deviation in which the lower surface of one line is flush with the upper surface of the other line in the thickness direction Z.

As illustrated in FIG. 2A, one end of the flexible wiring board 103 in the wiring direction X is attached to the connector 112, and the other end of the flexible wiring board 103 in the wiring direction X is attached to the connector 122. That is, in the present embodiment, the one end and the other end of the flexible wiring board 103 in the wiring direction X serve as electrodes, and when the electrodes of the flexible wiring board 103 contact electrodes of the connectors 112 and 122, the electrodes of the flexible wiring board 103 are electrically connected to the electrodes of the connectors 112 and 122. In the above-described configuration, when the semiconductor devices 111 and 121 are electrically connected with each other via the printed wiring board 110, the flexible wiring board 103, and the printed wiring board 120, the semiconductor devices 111 and 121 can communicate with each other.

Here, the configuration in which the flexible wiring board 103 is connected with the printed wiring boards 110 and 120 is not limited to the above-described configuration. For example, the one end of the flexible wiring board 103 in the wiring direction X may have a connector, and the connector may be attached to a connector of the printed wiring board 110. Similarly, the other end of the flexible wiring board 103 in the wiring direction X may have a connector, and the connector may be attached to a connector of the printed wiring board 120.

In another case, electrodes may be formed on the printed wiring board 110 and the flexible wiring board 103, and the printed wiring board 110 and the flexible wiring board 103 may be connected with each other without connectors. Similarly, electrodes may be formed on the printed wiring board 120 and the flexible wiring board 103, and the printed wiring board 120 and the flexible wiring board 103 may be connected with each other without connectors.

The semiconductor device 111, which is the first semiconductor device, sends and/or receives differential signals and a single-ended signal. In addition, the semiconductor device 121, which is the second semiconductor device, sends and/or receives differential signals and a single-ended signal.

In the communication between the semiconductor devices 111 and 121, the semiconductor device 111 may transmit digital signals to the semiconductor device 121, or the semiconductor device 121 may transmit digital signals to the semiconductor device 111. Hereinafter, the communication between the semiconductor devices 111 and 121 will be specifically described. For example, the semiconductor device 121 sends a control signal, which is a digital signal, to the semiconductor device 111; and the semiconductor device 111 sends a response signal, which is a digital signal, to the semiconductor device 121. The semiconductor device 111 sends data signals to the semiconductor device 121. The data signals are digital signals that represent image data. The control signal and the response signal may be single-ended signals, and the data signals may be differential signals. Thus, the flexible wiring board 103 includes a plurality of differential pairs 311S and 312S, and a plurality of signal lines 303S and 306S. Each of the differential pairs 311S and 312S has a pair of signal lines through which the differential signals are transmitted. The single-ended signals are transmitted through the signal lines 303S and 306S.

As illustrated in FIG. 2B, the differential pair 311S includes a signal line 301S and a signal line 302S. The signal line 301S is a first signal line used for transmitting a differential signal. The signal line 302S is a second signal line used for transmitting a differential signal. The signal line 301S and the signal line 302S are disposed adjacent to each other in the width direction Y. The signal line 303S is a third signal line used for transmitting a single-ended signal.

In addition, a ground line 300G is disposed between the signal line 301S and the signal line 303S. The ground line 300G is electrically connected to grounded conductor patterns of the printed wiring boards 110 and 120. Although not illustrated, a ground terminal of the semiconductor device 111 is electrically connected to the grounded conductor pattern of the printed wiring board 110. Similarly, a ground terminal of the semiconductor device 121 is electrically connected to the grounded conductor pattern of the printed wiring board 120.

The signal line 301S and the ground line 300G are disposed adjacent to each other in the width direction Y. The ground line 300G and the signal line 303S are disposed adjacent to each other in the width direction Y. The differential pair 312S includes a signal line 304S and a signal line 305S. The signal line 304S is a fourth signal line used for transmitting a differential signal. The signal line 305S is a fifth signal line used for transmitting a differential signal. The signal line 302S and the signal line 304S are disposed adjacent to each other in the width direction Y. The signal line 303S and the signal line 306S are disposed adjacent to each other in the width direction Y. That is, in the present embodiment, the lines 305S, 304S, 302S, 301S, 300G, 303S, and 306S are disposed in this order from the left side toward the right side of FIG. 2B, in the width direction Y.

Here, although the two differential pairs are used in the present embodiment to transmit differential signals, the number of differential pairs is not limited to two, and may be one or more. Similarly, although the two signal lines are used in the present embodiment to transmit single-ended signals, the number of signal lines through which the single-ended signals are transmitted is not limited to two, and may be one or more.

Next, a cross-sectional structure of the flexible wiring board 103 will be described in detail. As illustrated in FIG. 2B, the signal lines 301S, 302S, 304S, and 305S all have a line width of W1. The ground line 300G has a line width of W2. The signal lines 303S and 306S have a line width of W3. The distance between the signal lines 301S and 302S of the differential pair 311S in the width direction Y is D1. The distance between the signal lines 304S and 305S of the differential pair 312S in the width direction Y is also D1. The distance between the signal line 301S and the ground line 300G in the width direction Y is D2. The distance between the signal line 302S and the signal line 304S in the width direction Y is D3. The distance between the ground line 300G and the signal line 303S in the width direction Y is D4. The thickness of the lines in a thickness direction Z is T1, and the thicknesses of dielectric layers are T2 and T3. In FIGS. 2A and 2B, the thickness direction Z is orthogonal to the wiring direction X and the width direction Y.

As the amount of communication data has become large, high-speed differential signals on the order of gigabits per second (Gbps) are transmitted through the differential pairs 311S and 312S. The amplitude of the differential signals is about a few hundred to 800 mV. On the other hand, the single-ended signals transmitted through the signal lines 303S and 306S are clock signals on the order of a few kilohertz to a few hundred megahertz and slower than the differential signals, or data signals or control signals on the order of a few kilobits per second to a few hundred megabits per second. The amplitude of the single-ended signals is about 2.5 to 3.3 V. That is, the differential signals are higher in speed and smaller in amplitude than the single-ended signals. In other words, the single-ended signals are lower in speed and larger in amplitude than the differential signals. Thus, the differential signals are more affected by the crosstalk noise, than the single-ended signals.

In the present embodiment, the ground line 300G is disposed between the signal line 301S and the signal line 303S. With this arrangement, the ground line 300G can produce the shield effect that reduces the crosstalk from the signal line 303S to the differential pair 311S, in particular, from the signal line 303S to the signal line 301S. As a result, high quality of the differential signals can be kept.

The ground line 300G illustrated in FIG. 2B has its width and thickness substantially the same as those of the signal lines 301S, 302S, 303S, 304S, 305S, and 306S. Thus, the characteristic impedance of the ground line 300G is substantially the same as that of the signal lines. In addition, the ground line 300G has its electrical properties substantially the same as those of the signal lines. The ground line 300G is grounded on the printed wiring boards 110 and 120. Thus, the ground line 300G can be regarded as a line, both ends of which are grounded.

When high-speed (high-frequency) and short-wavelength signals are transmitted, the potential of the ground line may deviate from 0 V, depending on the length of the flexible wiring board 103 in the wiring direction X. That is, when the high-speed electrical signals are transmitted through the differential pair 311S, electromagnetic interference occurs between the signal line 301S of the differential pair 311S and the ground line 300G. Since both ends of the ground line 300G are grounded on the printed wiring boards 110 and 120, crosstalk noise from the signal line 301S of the differential pair 311S to the ground line 300G is repeatedly reflected off from the ground line 300G. The reflection is short reflection, that is, total reflection with opposite phase. The reflected wave returns to the signal line 301S of the differential pair 311S, as crosstalk noise.

Here, the differential signals transmitted through the two signal lines 301S and 302S are electrical signals whose phases are shifted from each other by 180 degrees. Thus, when one of the semiconductor devices receives the electrical signals, the semiconductor device detects a potential difference between the two signal lines. In the differential transmission system, when an identical noise is introduced to the two signal lines 301S and 302S, the noise will be canceled because the potential difference between the two signal lines is unchanged. However, if the level of one noise introduced to the signal line 301S is higher than the level of the other noise introduced to the signal line 302S, the noise will not be canceled and left even though the potential difference between the two signal lines is detected.

In the present embodiment, the distance D2 between the signal line 301S and the ground line 300G is larger than the distance D1 between the signal line 301S and the signal line 302S (D2>D1). With this arrangement, the electromagnetic coupling between the signal line 301S of the differential pair 311S and the ground line 300G is weaker than the electromagnetic coupling between the signal line 301S and the signal line 302S of the differential pair 311S. Thus, the electromagnetic interference between the signal line 301S of the differential pair 311S and the ground line 300G, that is, the crosstalk can be reduced. As a result, high quality of the differential signals can be kept.

In a case where a plurality of differential pairs are formed, a distance between adjacent differential pairs is preferably larger than the distance D1. In the present embodiment, since the two differential pairs 311S and 312S are formed, the distance D3 between the two differential pairs 311S and 312S is preferably larger than the distance D1. Thus, the electromagnetic interference between the differential pairs 311S and 312S, that is, the crosstalk can be reduced. As a result, high quality of the differential signals can be kept.

The amount of the electromagnetic interference between the differential pair 311S and the ground line 300G depends also on the length of lines of the flexible wiring board 103, specifically, on the length of the lines 301S, 302S, and 300G of the flexible wiring board 103. The electromagnetic interference increases when the lines 301S, 302S, and 300G have a length equal to or larger than a lower limit, which is expressed by the following expression (1):

$$\frac{2C_O}{\sqrt{\varepsilon r} \cdot R} \quad (1)$$

where R is a transmission speed (bps), εr is a relative dielectric constant of the dielectric 104 of the flexible wiring board 103.

In the expression (1), $C_O$ is the light speed of $3.0 \times 10^8$ m/s. The transmission speed R (bps) of the pulse signal can be converted to a frequency f (Hz) by using the equation of f=R/2. Thus, the expression (1) may be expressed as the following expression (2).

$$\frac{C_O}{\sqrt{\varepsilon r} \cdot f} \quad (2)$$

The expressions (1) and (2) express the relationship ($\lambda = C_O/((\sqrt{\varepsilon r}) \times 1)$) between the frequency f and the wavelength λ of the electromagnetic wave that propagates in a medium with the relative dielectric constant of εr. Here, when the length of the lines of the flexible wiring board 103 is larger than the wavelength of a fundamental frequency component of a pulse-wave signal (which is composed of a plurality of frequency components, each of which forms a sine wave), the lines constitute a distributed constant circuit. Thus, if impedance matching is insufficient at an end of each line, reflected wave from the end of the line increases.

In the expressions (1) and (2), a value obtained by dividing the light speed $C_O$ by the square root of the relative dielectric constant εr of the dielectric 104 of the flexible wiring board 103 is an effective propagation speed of the electrical signal (pulse signal) that propagates in the dielectric 104. Thus, when the length of the lines of the flexible wiring board 103 is larger than the value obtained through the expression (1), the impedance matching at the end of the lines becomes insufficient, and the amplitude of the reflected wave increases. As a result, the electromagnetic interference will easily occur between the signal line 301S and the ground line 300G. In the present embodiment, however, even when the length of the lines of the flexible wiring board 103 is larger than the value obtained through the expression (1), the electromagnetic interference between the signal line 301S and the ground line 300G, that is, the crosstalk can be effectively reduced by making the distance D2 larger than the distance D1.

Here, the waveform of a pulse signal is composed of a plurality of frequency components, each of which forms a sine wave. Thus, in order to transmit the pulse signal without any trouble, not only the crosstalk of a component of the fundamental frequency f (Hz), but also the crosstalk in a frequency range from the fundamental frequency f (Hz) to a frequency at least three times higher than the fundamental frequency f is necessary to be reduced. Hereinafter, some simulation results will be described. Here, the fundamental frequency f (Hz) is the above-described frequency f (Hz), and is obtained by dividing the transmission speed R (bps) by two.

Simulation 1

In simulation 1, the transmission property to the differential signals transmitted through the differential pair 311S is simulated. Since the transmission property depends on the length of the lines of the flexible wiring board 103, and on the distance D2 between the differential pair 311S and the ground line 300G, simulation results are illustrated in the relationship between the transmission property and parameters of the length and the distance D2. Here, as the transmission property increases, the electromagnetic interference between the signal line 301S and the ground line 300G decreases, reducing the crosstalk noise and improving the quality of the differential signals. In this simulation, the transmission speed R of the differential signals, which are pulse signals, is 10 Gbps; and the fundamental frequency f of the pulse signal is 5 GHz.

For dealing with simple electromagnetic interference, the simulation was performed on only the differential pair 311S and the ground line 300G. Parameters of the flexible wiring board 103 used for the simulation will be described.

The line width W1 of the signal lines 301S and 302S is 100 μm. The line width W2 of the ground line 300G is 100 μm. The distance D1 between the signal lines 301S and 302S is 60 μm. The distance D2 between the differential pair 311S and the ground line 300G was changed in a range from 60 to 240 μm. The thickness T1 of the lines 300G, 301S, and 302S is 6 μm. The thickness T2 of a dielectric layer (cover material) disposed above the lines is 21.5 μm. The thickness T3 of a dielectric layer (base material) disposed below the lines is 25 μm. The material of the lines is copper. The relative dielectric constant of the dielectric of the dielectric layer disposed above the lines is 3.38. The relative dielectric constant of the dielectric of the dielectric layer disposed below the lines is 3.2. The dielectric tangent of the dielectric layer disposed above the lines is 0.025. The dielectric tangent of the dielectric layer disposed below the lines is 0.005. The length of the lines of the flexible wiring board 103 was changed in a range from 25 to 100 mm. The length obtained by substituting the above-described parameters in the expression (1) is 33 mm. The relative dielectric constant used is 3.29 that is an average of the relative dielectric constant of the dielectric of the dielectric layer disposed above the lines and the relative dielectric constant of the dielectric of the dielectric layer disposed below the lines.

Parameters of lines of the printed wiring boards 110 and 120 used for the simulation will be described. Lines through which the differential signals are transmitted have a differential impedance of 94Ω, and a length of 30 mm. Lines through which the single-ended signals are transmitted have a characteristic impedance of 50Ω, and a length of 30 mm.

The printed wiring board 110, the flexible wiring board 103, and the printed wiring board 120 are electrically connected with each other, and S parameters obtained when signals propagate in the three wiring boards were calculated by using Hyper Lynx of Mentor. Among the S parameters, a parameter Sdd21 was used to estimate the transmission property obtained when the differential signals propagate in the signal lines 301S and 302S; and was calculated, with the frequency changed. FIGS. 3A, 3B, 4A, and 4B are graphs illustrating the simulation results.

Figure 3A:
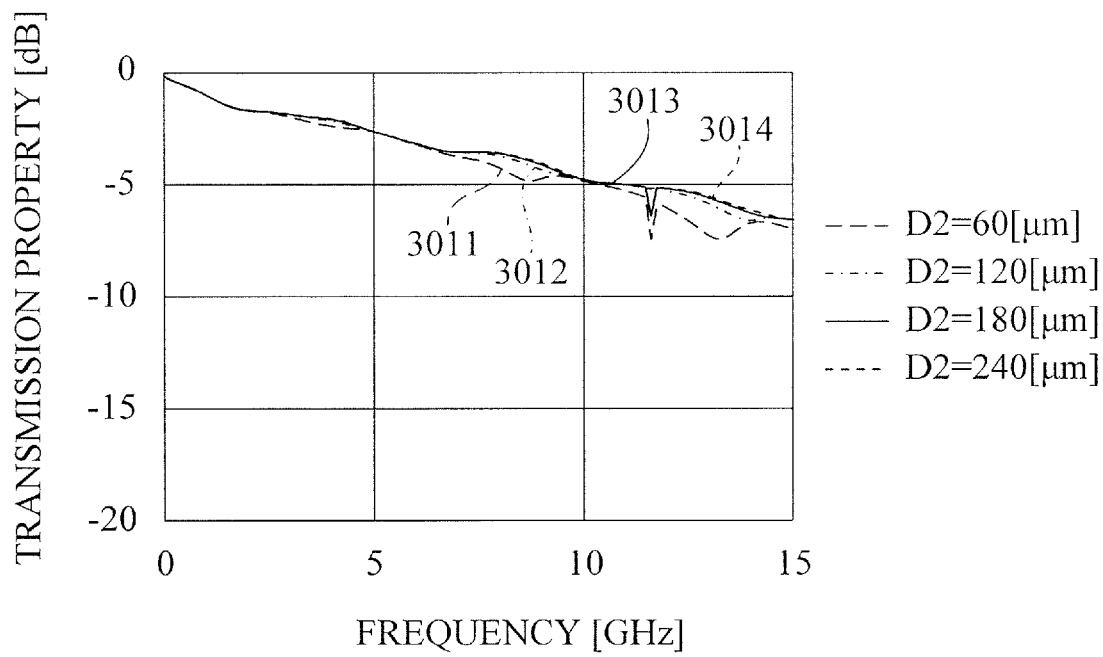
FIG. 3A is a graph of a simulation result obtained in the first embodiment.
Figure 3B:
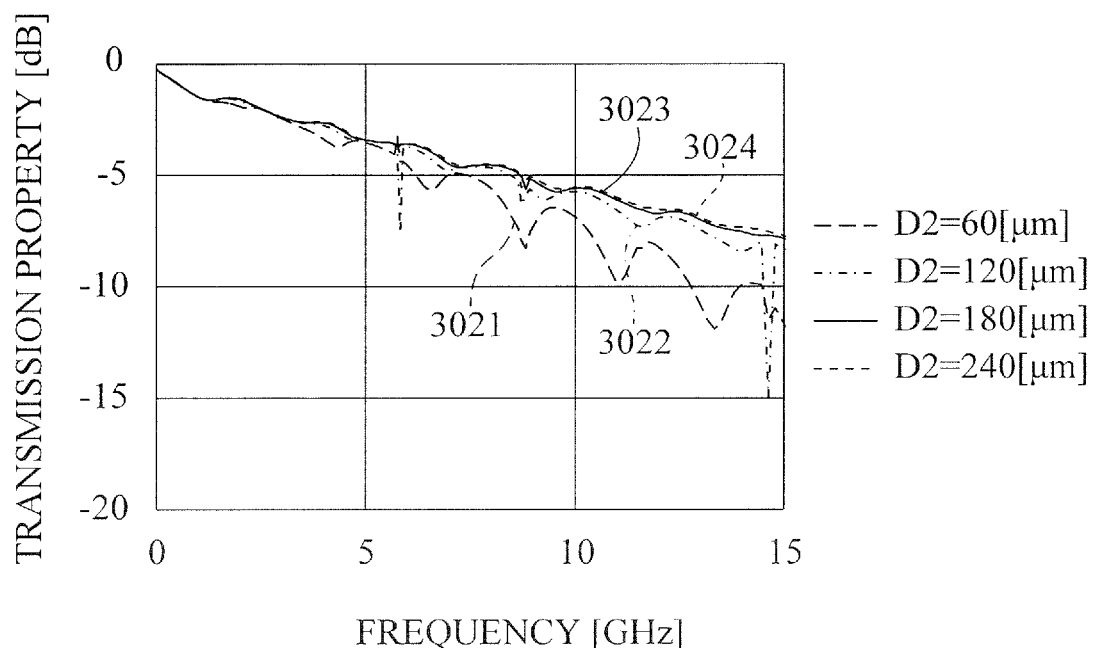
FIG. 3B is a graph of a simulation result obtained in the first embodiment.

The vertical axis of the graphs of FIGS. 3A, 3B, 4A, and 4B represents the level of the transmission property Sdd21 of the differential signals, and the unit of the level is dB. The horizontal axis of the graphs represents the frequency, and the unit of the frequency is GHz. Hereinafter, the length of the lines of the flexible wiring board 103 is referred to as a length of the flexible wiring board 103. FIG. 3A illustrates a simulation result obtained when the length of the flexible wiring board 103 is 25 mm. FIG. 3B illustrates a simulation result obtained when the length of the flexible wiring board 103 is 50 mm. FIG. 4A illustrates a simulation result obtained when the length of the flexible wiring board 103 is 75 mm. FIG. 4B illustrates a simulation result obtained when the length of the flexible wiring board 103 is 100 mm.

In the graphs of FIGS. 3A, 3B, 4A, and 4B, simulation results obtained when the distance D2 is 60 μm are indicated by long-dash lines 3011, 3021, 3031, and 3041. Simulation results obtained when the distance D2 is 120 μm are indicated by dot-and-dash lines 3012, 3022, 3032, and 3042. Simulation results obtained when the distance D2 is 180 μm are indicated by solid lines 3013, 3023, 3033, and 3043. Simulation results obtained when the distance D2 is 240 μm are indicated by short-dash lines 3014, 3024, 3034, and 3044.

In FIG. 3A, since the length of the flexible wiring board 103 is 25 mm, the length is smaller than 33 mm obtained through the expression (1). When the frequency is 5 GHz, the transmission properties indicated by the dot-and-dash line 3012 (D2=120 μm), the solid line 3013 (D2=180 μm), and the short-dash line 3014 (D2=240 μm) are slightly better than the transmission property indicated by the long-dash line 3011 (D2=60 μm). When the frequency is 15 GHz that is a frequency of the third harmonic, the transmission properties indicated by the solid line 3013 (D2=180 μm) and the short-dash line 3014 (D2=240 μm) are slightly better than the transmission property indicated by the dot-and-dash line 3012 (D2=120 μm.

In FIG. 3B, since the length of the flexible wiring board 103 is 50 mm, the length is larger than 33 mm obtained through the expression (1). When the frequency is 5 GHz, the transmission properties indicated by the dot-and-dash line 3022 (D2=120 μm), the solid line 3023 (D2=180 μm), and the short-dash line 3024 (D2=240 μm) are better than the transmission property indicated by the long-dash line 3021 (D2=60 μm). When the frequency is 15 GHz that is a frequency of the third harmonic, the transmission properties indicated by the solid line 3023 (D2=180 μm) and the short-dash line 3024 (D2=240 μm) are better than the transmission property indicated by the dot-and-dash line 3022 (D2=120 μm).

In FIG. 4A, since the length of the flexible wiring board 103 is 75 mm, the length is larger than 33 mm obtained through the expression (1). When the frequency is 5 GHz, the transmission properties indicated by the dot-and-dash line 3032 (D2=120 μm), the solid line 3033 (D2=180 μm), and the short-dash line 3034 (D2=240 μm) are better than the transmission property indicated by the long-dash line 3031 (D2=60 μm). When the frequency is 15 GHz that is a frequency of the third harmonic, the transmission properties indicated by the solid line 3033 (D2=180 μm) and the short-dash line 3034 (D2=240 μm) are better than the transmission property indicated by the dot-and-dash line 3032 (D2=120 μm).

In FIG. 4B, since the length of the flexible wiring board 103 is 100 mm, the length is larger than 33 mm obtained through the expression (1). When the frequency is 5 GHz, the transmission properties indicated by the dot-and-dash line 3042 (D2=120 μm), the solid line 3043 (D2=180 μm), and the short-dash line 3044 (D2=240 μm) are better than the transmission property indicated by the long-dash line 3041 (D2=60 μm). When the frequency is 15 GHz that is a frequency of the third harmonic, the transmission properties indicated by the solid line 3043 (D2=180 μm) and the short-dash line 3044 (D2=240 μm) are better than the transmission property indicated by the dot-and-dash line 3042 (D2=120 μm).

Thus, it can be seen from the simulation results that when the length of the flexible wiring board 103 is equal to or larger than the value obtained through the expression (1), the transmission property Sdd21 is more effectively improved by making the distance D2 larger than the distance D1. In particular, when the distance D2 is equal to or larger than two times the distance D1, the quality of the signal can be more increased. Here, even when the length of the flexible wiring board 103 is smaller than the value obtained through the expression (1), the transmission property Sdd21 is improved by making the distance D2 larger than the distance D1. In addition, since the difference between the transmission property obtained when the distance D2 is 180 μm and the transmission property obtained when the distance D2 is 240 μm is slight, those transmission properties are saturated. Thus, when the distance D2 is equal to or smaller than three times the distance D1, the width of the flexible wiring board 103 can be kept narrow while the quality of signals is sufficiently ensured. That is, the flexible wiring board 103 can be downsized.

Simulation 2

Hereinafter, other simulation results on the voltage of crosstalk noise will be described. In this case, the crosstalk noise propagates from a signal line through which a single-ended signal is transmitted, to signal lines through which differential signals are transmitted.

Figure 5:
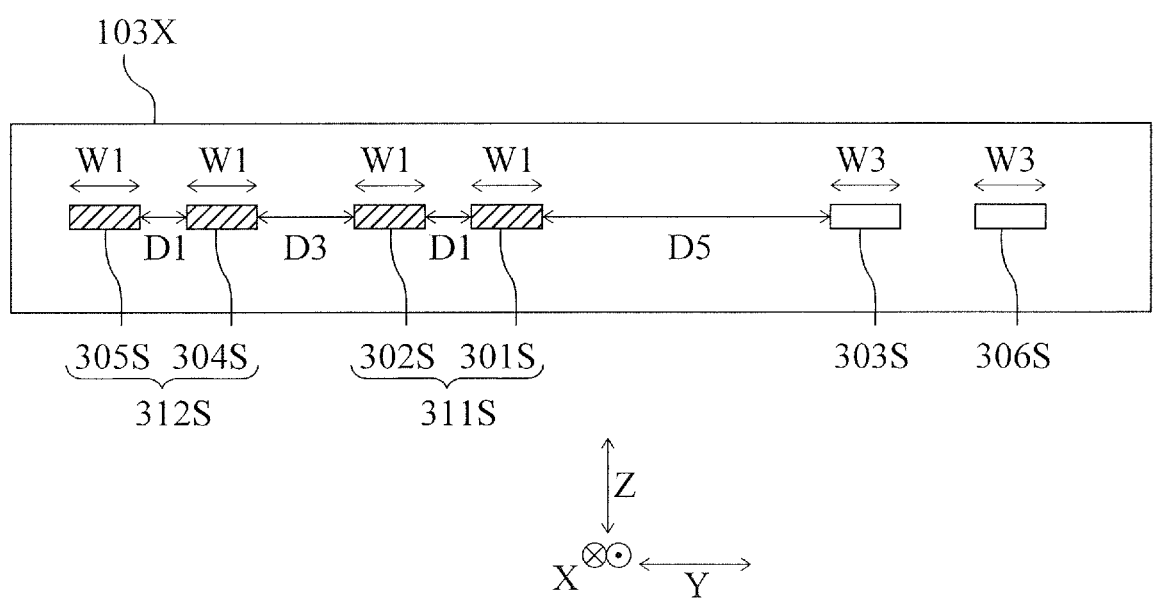
FIG. 5 is a cross-sectional view of a flexible wiring board of a comparative example.

For dealing with simple electromagnetic interference, the simulation was performed on only the differential pair 311S, the ground line 300G, and the signal line 303S. FIG. 5 is a cross-sectional view of a flexible wiring board 103X of a comparative example. The flexible wiring board 103X has a structure in which the ground line of the flexible wiring board 103 of the first embodiment is not formed. In the flexible wiring board 103X of the comparative example, the distance between the signal line 301S of the differential pair 311S and the signal line 303S is D5. The other configuration of the flexible wiring board 103X is the same as that of the flexible wiring board 103.

The crosstalk noise voltage was calculated when the distance D5 was 180 μm, 360 μm, and 600 μm in the comparative example. In addition, in the structure of the present embodiment, the crosstalk noise voltage was calculated when the distance D2 between the signal line 301S and the ground line 300G was 180 μm and the distance between the ground line 300G and the signal line 303S was 60 μm. In this case, the distance D1 between the signal line 301S and the signal line 302S is 60 μm, and the distance D2 is larger than the distance D1. In both the comparative example and the present embodiment, the length of the flexible wiring board is 100 mm.

The single-ended signal is a repetitive pulse signal, and has an amplitude of 3.3 V and a frequency of 100 MHz. The rise/fall time of the single-ended signal is 0.9 nanoseconds that correspond to 20 to 80% of the amplitude. Since the single-ended repetitive signal transmitted through the signal line 303S has a frequency of 100 MHz, the expression (1) indicates that the signal quality will be deteriorated by the electromagnetic interference between the signal line 303S and the ground line 300G when the length of the lines is about 1.6 m or more. Thus, the deterioration in the signal quality caused by the electromagnetic interference between the signal line 303S and the ground line 300G can be ignored.

Since the differential voltage was made constant at a high level (about 350 mV), the amount of variation from the high level becomes the crosstalk noise voltage introduced to the differential signals. The waveform of the differential signals was observed at a point at which the semiconductor device 121 was connected with the printed wiring board 120. The differential signals were outputted from the semiconductor device 111, and received by the semiconductor device 121. The single-ended signal was outputted from the semiconductor device 121, and received by the semiconductor device 111. The crosstalk produced in this case is near-end crosstalk. The crosstalk noise voltage was calculated by using HSPICE (registered trademark) of Synopsys, Inc.

Figure 6:
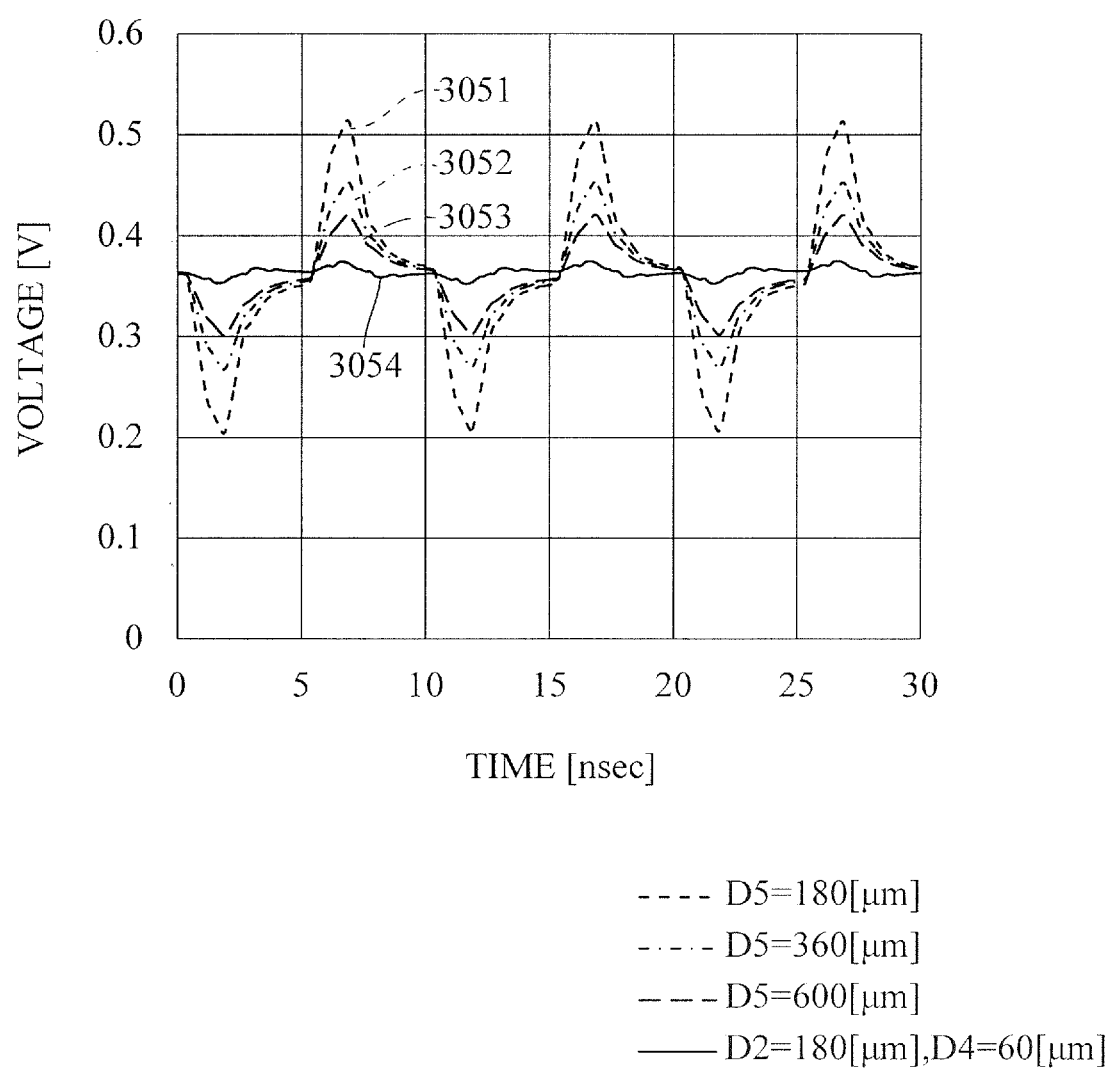
FIG. 6 is a graph of a simulation result obtained in the first embodiment.

FIG. 6 is a graph illustrating waveforms of the crosstalk noise voltage, which are simulation results obtained in the first embodiment. The vertical axis represents the voltage (V), and the horizontal axis represents the time (nanoseconds). A crosstalk noise waveform 3051 obtained when the distance D5 is 180 μm in the comparative example is indicated by a short-dash line. The crosstalk noise voltage (peak-to-peak value) of the crosstalk noise waveform 3051 is 0.316 V. A crosstalk noise waveform 3052 obtained when the distance D5 is 360 μm in the comparative example is indicated by a dot-and-dash line. The crosstalk noise voltage of the crosstalk noise waveform 3052 is 0.189 V. A crosstalk noise waveform 3053 obtained when the distance D5 is 600 μm in the comparative example is indicated by a long-dash line. The crosstalk noise voltage of the crosstalk noise waveform 3053 is 0.122 V. In contrast, a crosstalk noise waveform 3054 obtained when the distance D2 is 180 μm and the distance D4 is 60 μm in the present embodiment, is indicated by a solid line. The crosstalk noise voltage of the crosstalk noise waveform 3054 is 0.023 V.

When the distance D5 is 600 μm in the case where the ground line is not formed between the signal line 301S and the signal line 303S, the crosstalk noise voltage is 0.122 V. Here, when the ground line is formed between the signal line 301S and the signal line 303S, the distance between the signal line 301S and the signal line 303S is 340 μm, which is the sum of D2 (180 μm), W2 (100 μm), and D4 (60 μm). Thus, even though the distance between the signal line 301S and the signal line 303S is 340 μm, the crosstalk noise voltage is 0.023 V. In this manner, the crosstalk can be reduced, even when the distance is small, by arranging the ground line 300G between the signal line 301S and the signal line 303S.

Modification 1

Figure 7A:
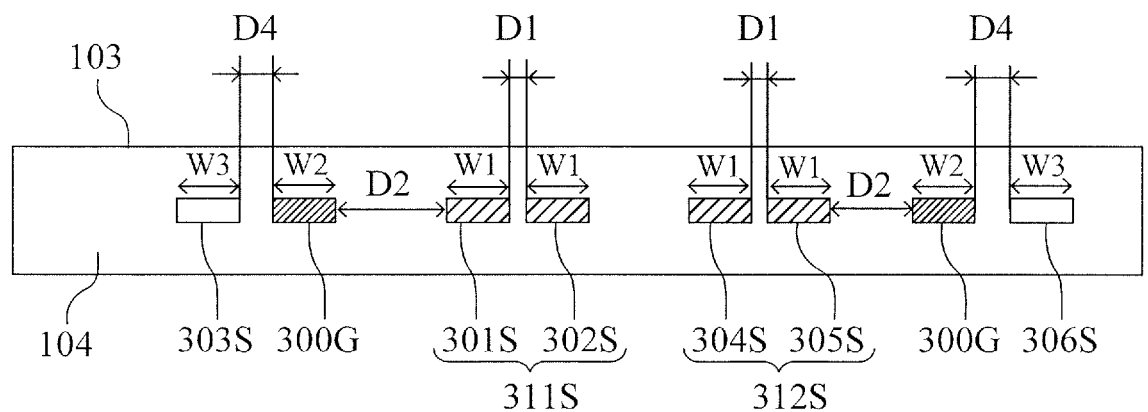
FIG. 7A is a cross-sectional view of a flexible wiring board of a modification.
Figure 7B:
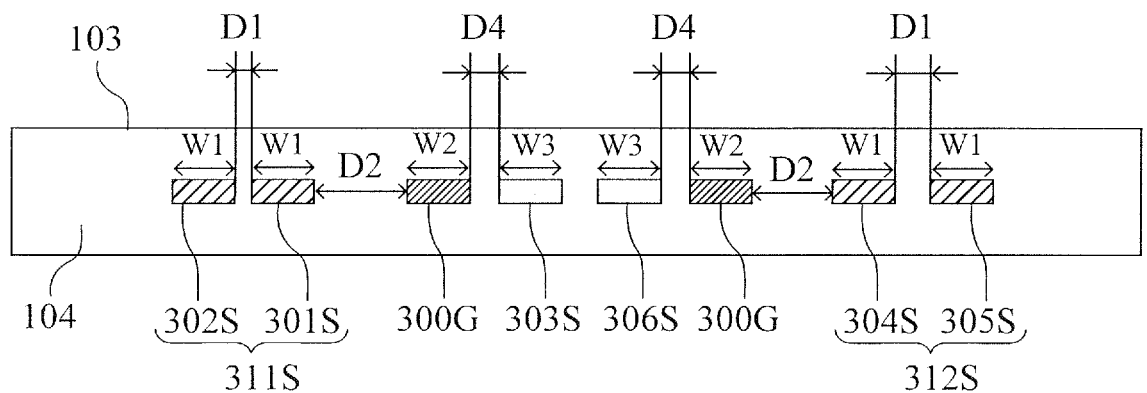
FIG. 7B is a cross-sectional view of a flexible wiring board of another modification.

FIGS. 7A and 7B are cross-sectional views of flexible wiring boards of a modification. As long as the ground line is disposed between the first signal line of the differential pair and the third signal line used for the single-ended signal, and the distance D2 is larger than the distance D1, any wiring structure is applicable as illustrated in FIGS. 7A and 7B. For example, as illustrated in FIG. 7A, the differential pairs 311S and 312S may be disposed between ground lines 300G and 300G, and the signal lines 303S and 306S used for single-ended signals may be disposed outside the ground lines 300G and 300G. In addition, as illustrated in FIG. 7B, the signal lines 303S and 306S may be disposed between ground lines 300G and 300G, and the differential pairs 311S and 312S may be disposed outside the ground lines 300G and 300G. That is, the first signal line and the second signal line of the differential pair, the third signal line used for single-ended signals, and the ground line may constitute one of a plurality of sets, and the sets may be disposed in the width direction.

Second Embodiment

Figure 8A:
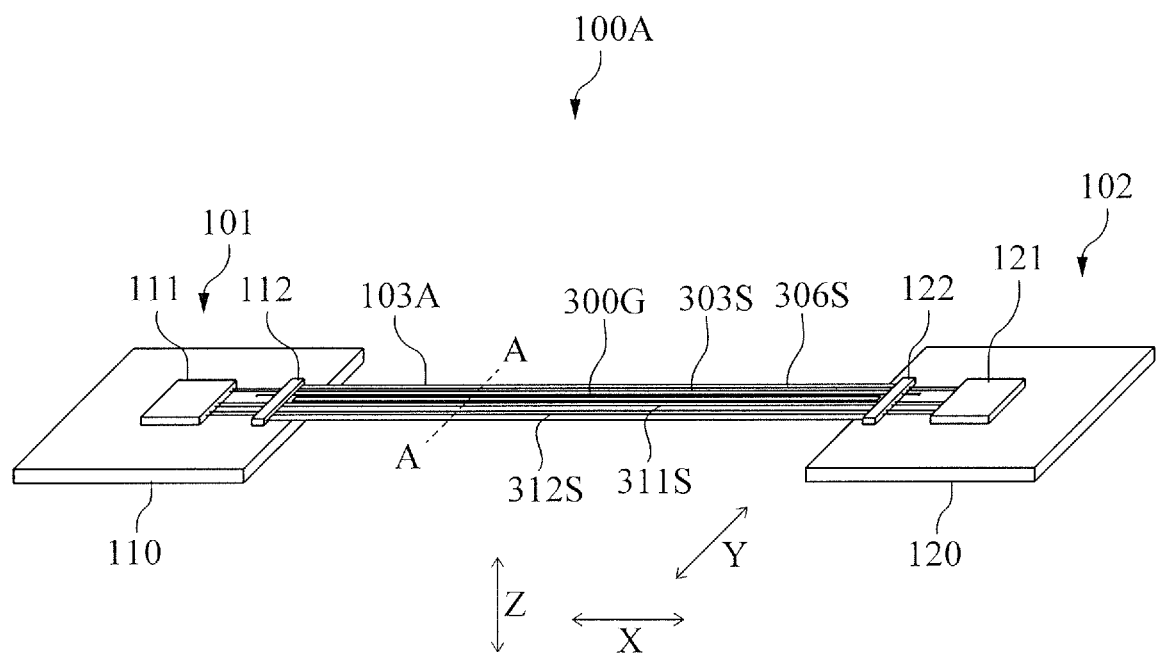
FIG. 8A is a diagram illustrating an image pickup unit that is one example of transmission circuits of a second embodiment.

Next, a transmission circuit of a second embodiment will be described. FIG. 8A is a diagram illustrating an image pickup unit 100A that is one example of transmission circuits of the second embodiment. In the second embodiment, the image pickup unit 100A is used in the digital camera 600, in place of the image pickup unit 100. The digital camera 600 described in the first embodiment is one example of electronic devices. In the second embodiment, a component identical to a component of the first embodiment is given an identical symbol, and the description thereof will be omitted.

The image pickup unit 100A illustrated in FIG. 8A includes printed circuit boards 101 and 102, which are the same as those of the first embodiment. The image pickup unit 100A includes a single flexible wiring board 103A that electrically connects the printed circuit board 101 and the printed circuit board 102. The flexible wiring board 103A allows the weight of the wiring structure to be lower than the weight of a wiring structure including coaxial cables.

Figure 8B:
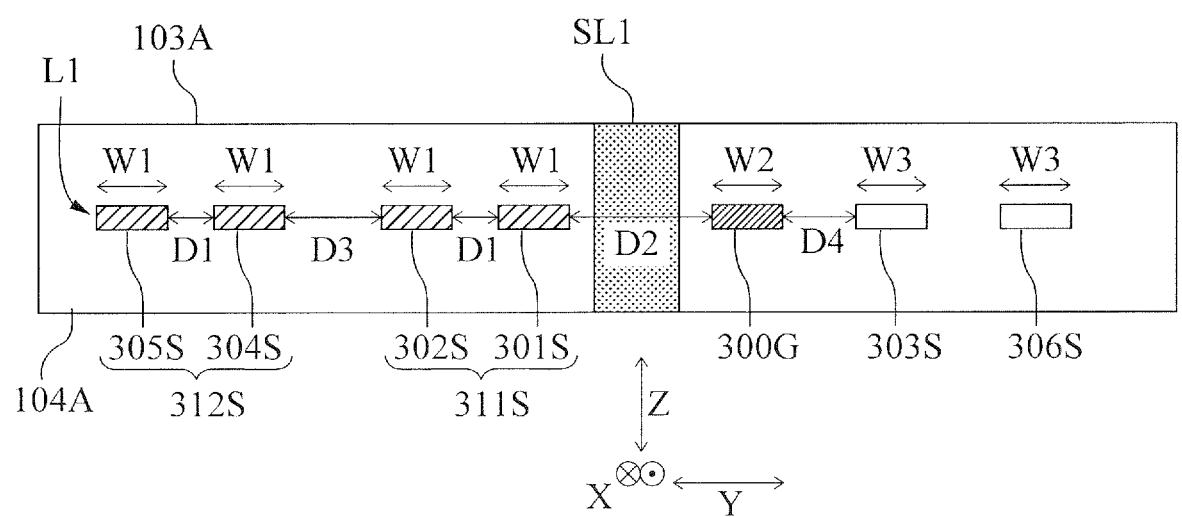
FIG. 8B is a cross-sectional view of a flexible wiring board of the second embodiment.

FIG. 8B is a cross-sectional view of the flexible wiring board 103A, taken along a line A-A. As illustrated in FIG. 8B, the flexible wiring board 103A is a single-layer substrate having a single conductor layer. Thus, the flexible wiring board 103A is made thinner and highly flexible. Consequently, the flexible wiring board 103A can be easily arranged in the housing 611 (FIG. 1), allowing the digital camera to be thinner and lightened. The flexible wiring board 103A includes a plurality of lines 300G, 301S, 302S, 303S, 304S, 305S, and 306S, which are the same as those of the first embodiment. The lines are disposed in an identical conductor layer L1, with adjacent lines separated from each other in a width direction Y; and extend in a wiring direction X orthogonal to the width direction Y. The lines 300G, 301S, 302S, 303S, 304S, 305S, and 306S are conductor patterns disposed in the conductor layer L1. The material of the lines 300G, 301S, 302S, 303S, 304S, 305S, and 306S may be copper. The flexible wiring board 103A includes a dielectric 104A that holds the lines 300G, 301S, 302S, 303S, 304S, 305S, and 306S. The material of the dielectric 104A may be polyimide or polyester. Although the plurality of lines 300G, 301S, 302S, 303S, 304S, 305S, and 306S are disposed in the identical conductor layer L1, two adjacent lines of the plurality of lines may slightly deviate from each other in a thickness direction Z. That is, when two adjacent lines deviate from each other, the allowable range of deviation is below the deviation in which the lower surface of one line is flush with the upper surface of the other line in the thickness direction Z.

As illustrated in FIG. 8A, one end of the flexible wiring board 103A in the wiring direction X is attached to the connector 112, and the other end of the flexible wiring board 103A in the wiring direction X is attached to the connector 122. That is, in the present embodiment, the one end and the other end of the flexible wiring board 103A in the wiring direction X serve as electrodes, and when the electrodes of the flexible wiring board 103A contact electrodes of the connectors 112 and 122, the electrodes of the flexible wiring board 103 are electrically connected to the electrodes of the connectors 112 and 122. In the above-described configuration, when the semiconductor devices 111 and 121 are electrically connected with each other via the printed wiring board 110, the flexible wiring board 103A, and the printed wiring board 120, the semiconductor devices 111 and 121 can communicate with each other.

Here, the configuration in which the flexible wiring board 103A is electrically connected with the printed wiring boards 110 and 120 is not limited to the above-described configuration. For example, the one end of the flexible wiring board 103A in the wiring direction X may have a connector, and the connector may be attached to the connector 112 of the printed wiring board 110. Similarly, the other end of the flexible wiring board 103A in the wiring direction X may have a connector, and the connector may be attached to the connector 122 of the printed wiring board 120.

In another case, electrodes may be formed on the printed wiring board 110 and the flexible wiring board 103A, and the printed wiring board 110 and the flexible wiring board 103A may be connected with each other without connectors. Similarly, electrodes may be formed on the printed wiring board 120 and the flexible wiring board 103A, and the printed wiring board 120 and the flexible wiring board 103A may be connected with each other without connectors.

As illustrated in FIG. 8B, the differential pair 311S includes the signal line 301S and the signal line 302S. The signal line 301S is a first signal line used for transmitting a differential signal. The signal line 302S is a second signal line used for transmitting a differential signal. The signal line 301S and the signal line 302S are disposed adjacent to each other in the width direction Y. The signal line 303S is a third signal line used for transmitting a single-ended signal. In addition, the ground line 300G is disposed between the signal line 301S and the signal line 303S.

The ground line 300G is electrically connected to grounded conductor patterns of the printed wiring boards 110 and 120. Although not illustrated, a ground terminal of the semiconductor device 111 is electrically connected to the grounded conductor pattern of the printed wiring board 110. Similarly, a ground terminal of the semiconductor device 121 is electrically connected to the grounded conductor pattern of the printed wiring board 120.

The signal line 301S and the ground line 300G are disposed adjacent to each other in the width direction Y. The ground line 300G and the signal line 303S are disposed adjacent to each other in the width direction Y. The differential pair 312S includes the signal line 304S and the signal line 305S. The signal line 304S is a fourth signal line used for transmitting a differential signal. The signal line 305S is a fifth signal line used for transmitting a differential signal. The signal line 302S and the signal line 304S are disposed adjacent to each other in the width direction Y. The signal line 303S and the signal line 306S are disposed adjacent to each other in the width direction Y. That is, in the present embodiment, the lines 305S, 304S, 302S, 301S, 300G, 303S, and 306S are disposed in this order from the left side toward the right side of FIG. 8B, in the width direction Y.

Here, although the two differential pairs are used in the present embodiment to transmit differential signals, the number of differential pairs is not limited to two, and may be one or more. Similarly, although the two signal lines are used in the present embodiment to transmit single-ended signals, the number of signal lines through which the single-ended signals are transmitted is not limited to two, and may be one or more.

In the present embodiment, the ground line 300G is disposed between the signal line 301S and the signal line 303S. With this arrangement, the ground line 300G can produce the shield effect that reduces the crosstalk from the signal line 303S to the differential pair 311S, in particular, from the signal line 303S to the signal line 301S.

In addition, a slit SL1 is formed between the signal line 301S and the ground line 300G, and extending in the wiring direction X. The distance D2 between the signal line 301S and the ground line 300G is larger than the distance D1 between the signal line 301S and the signal line 302S (D2>D1). Thus, even though the slit SL1 is formed between the signal line 301S and the ground line 300G, the electromagnetic coupling between the signal line 301S and the ground line 300G is weaker than the electromagnetic coupling between the signal line 301S and the signal line 302S. Thus, the electromagnetic interference between the signal line 301S of the differential pair 311S and the ground line 300G, that is, the crosstalk can be reduced. As a result, high quality of the differential signals can be kept.

In a case where a plurality of differential pairs are formed, a distance between adjacent differential pairs is preferably larger than the distance D1. In the present embodiment, since the two differential pairs 311S and 312S are formed, the distance D3 between the two differential pairs is preferably larger than the distance D1. Thus, the electromagnetic interference between the differential pairs 311S and 312S, that is, the crosstalk can be reduced. As a result, high quality of the differential signals can be kept.

Modification 2

Figure 9A:
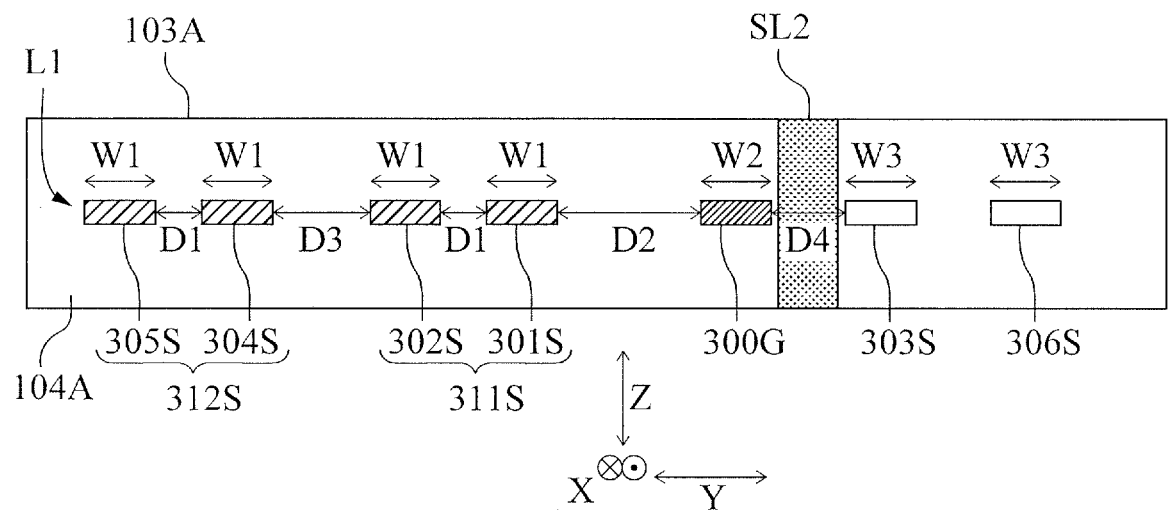
FIG. 9A is a cross-sectional view of a flexible wiring board of a modification.
Figure 9B:
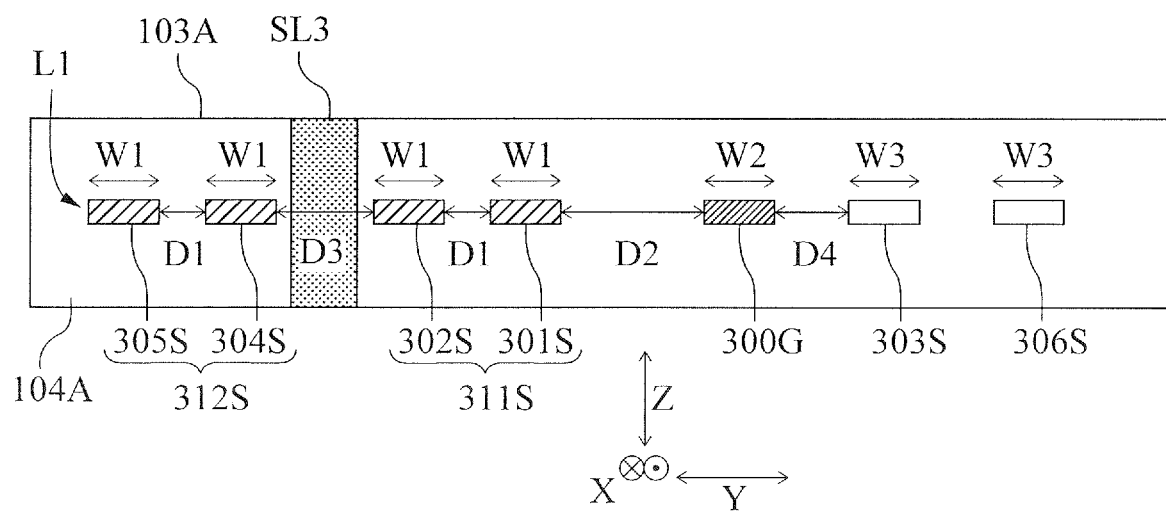
FIG. 9B is a cross-sectional view of a flexible wiring board of another modification.

In the second embodiment, the slit SL1 is formed between the signal line 301S and the ground line 300G in the flexible wiring board 103A. However, the position of the slit SL1 is not limited to the above-described position. FIG. 9A is a cross-sectional view of a flexible wiring board of a modification, taken along a line of A-A. FIG. 9B is a cross-sectional view of a flexible wiring board of another modification, taken along a line of A-A. As illustrated in FIG. 9A, a slit SL2 may be formed between the ground line 300G and the signal line 303S. Even in this case, if the distance D2 is larger than the distance D1, high quality of the differential signals can be kept. Preferably, the distance D3 is larger than the distance D1. If the distance D3 is larger than the distance D1, the crosstalk between the two differential pairs 311S and 312S can be reduced, and high quality of the differential signals can be kept.

In addition, as illustrated in FIG. 9B, in a case where the plurality of differential pairs 311S and 312S are formed, the slit SL3 may be formed between the signal line 302S of the differential pair 311S and the signal line 304S of the differential pair 312S. Even in this case, if the distance D2 is larger than the distance D1, high quality of the differential signals can be kept. Preferably, the distance D3 is larger than the distance D1. If the distance D3 is larger than the distance D1, the crosstalk between the two differential pairs 311S and 312S can be reduced, and high quality of the differential signals can be kept.

Although not illustrated, the slits SL1 and SL2 may be formed in the flexible wiring board, the slits SL2 and SL3 may be formed in the flexible wiring board, or the slits SL1, SL2, and SL3 may be formed in the flexible wiring board. In any case, if the distance D2 is larger than the distance D1, high quality of the differential signals can be kept. Preferably, the distance D3 is larger than the distance D1. If the distance D3 is larger than the distance D1, the crosstalk between the differential pairs 311S and 312S can be reduced, and high quality of the differential signals can be kept.

Third Embodiment

Figure 10A:
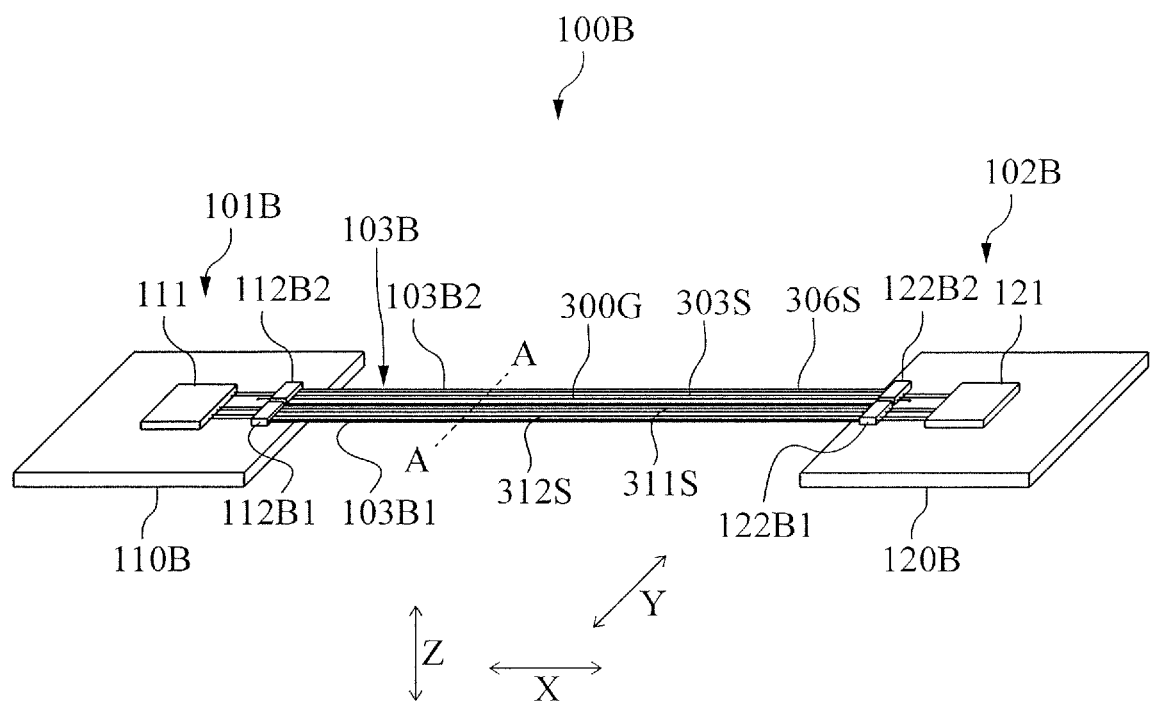
FIG. 10A is a diagram illustrating an image pickup unit that is one example of transmission circuits of a third embodiment.

Next, a transmission circuit of a third embodiment will be described. FIG. 10A is a diagram illustrating an image pickup unit 100B that is one example of transmission circuits of the third embodiment. In the third embodiment, the image pickup unit 100B is used in the digital camera 600, in place of the image pickup unit 100. The digital camera 600 described in the first embodiment is one example of electronic devices. In the third embodiment, a component identical to a component of the first embodiment is given an identical symbol, and the description thereof will be omitted.

The image pickup unit 100B illustrated in FIG. 10A includes a printed circuit board 101B and a printed circuit board 102B. In addition, the image pickup unit 100B includes a plurality of flexible wiring boards 103B1 and 103B2 that electrically connect the printed circuit board 101B and the printed circuit board 102B. The flexible wiring board 103B1 may be referred to as a first flexible wiring board, and the flexible wiring board 103B2 may be referred to as a second flexible wiring board. The flexible wiring boards 103B1 and 103B2 allow the weight of the wiring structure to be lower than the weight of a wiring structure including coaxial cables.

The printed circuit board 101B includes a printed wiring board 110B, a semiconductor device 111 mounted on the printed wiring board 110B, and a plurality of connectors 112B1 and 112B2 mounted on the printed wiring board 110B. The semiconductor device 111 is the same as that of the first embodiment. The connectors 112B1 and 112B2 connect lines of the flexible wiring boards 103B1 and 103B2 and conductors formed on the printed wiring board 110B. The lines of the flexible wiring boards 103B1 and 103B2 are electrically connected to the semiconductor device 111 via the connectors 112B1 and 112B2. The printed circuit board 102B includes a printed wiring board 120B, a semiconductor device 121 mounted on the printed wiring board 120B, and a plurality of connectors 122B1 and 122B2 mounted on the printed wiring board 120B. The semiconductor device 121 is the same as that of the first embodiment. The connectors 122B1 and 122B2 connect lines of the flexible wiring boards 103B1 and 103B2 and conductors formed on the printed wiring board 120B. The lines of the flexible wiring boards 103B1 and 103B2 are electrically connected to the semiconductor device 121 via the connectors 122B1 and 122B2.

Figure 10B:
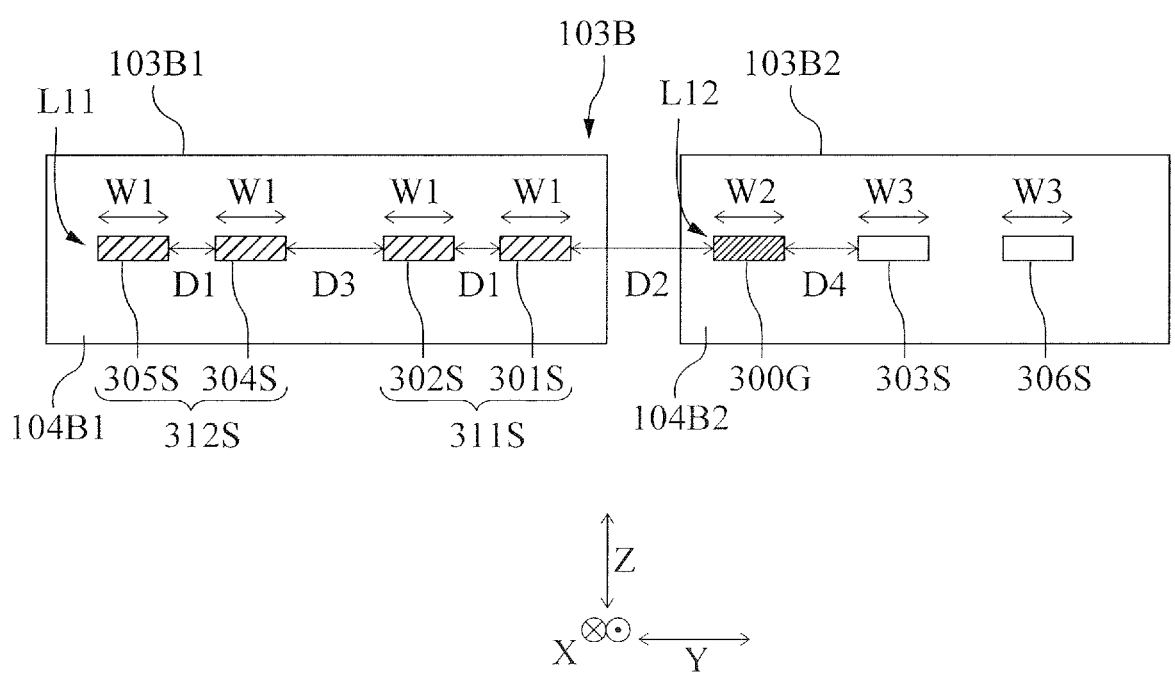
FIG. 10B is a cross-sectional view of a flexible wiring board of the third embodiment.

FIG. 10B is a cross-sectional view of the flexible wiring boards 103B1 and 103B2, taken along a line A-A. As illustrated in FIG. 10B, each of the flexible wiring boards 103B1 and 103B2 is a single-layer substrate having a single conductor layer. Thus, the flexible wiring boards 103B1 and 103B2 are made thinner and highly flexible. Consequently, the flexible wiring boards 103B1 and 103B2 can be easily arranged in the housing 611 (FIG. 1), allowing the digital camera to be thinner and lightened. The plurality of flexible wiring boards 103B1 and 103B2 are disposed adjacent to each other in the width direction Y. The plurality of flexible wiring boards 103B1 and 103B2 constitute a wiring unit 103B. The wiring unit 103B includes lines 300G, 301S, 302S, 303S, 304S, 305S, and 306S, which are the same as those of the first embodiment. Specifically, the flexible wiring board 103B1 includes a differential pair 311S, which includes the signal line 301S and the signal line 302S used for transmitting differential signals. The signal line 301S is a first signal line, and the signal line 302S is a second signal line. The flexible wiring board 103B1 further includes the differential pair 312S, which includes the signal line 304S and the signal line 305S used for transmitting differential signals. The signal line 304S is a fourth signal line, and the signal line 305S is a fifth signal line. The flexible wiring board 103B2 includes the signal line 303S, the ground line 300G, and the signal line 306S. The signal line 303S is a third signal line used for transmitting a single-ended signal. The signal line 306S is used for transmitting a single-ended signal.

The flexible wiring board 103B1 includes a single conductor layer L11. The flexible wiring board 103B2 includes a single conductor layer L12. The lines 301S, 302S, 304S, and 305S are conductor patterns disposed in the identical conductor layer L11. The lines 300G, 303S, and 306S are conductor patterns disposed in the identical conductor layer L12. The material of the lines 300G, 301S, 302S, 303S, 304S, 305S, and 306S may be copper. The flexible wiring board 103B1 includes a dielectric 104B1 that holds the lines 301S, 302S, 304S, and 305S. The flexible wiring board 103B2 includes a dielectric 104B2 that holds the lines 300G, 303S, and 306S. The material of the dielectrics 104B1 and 104B2 may be polyimide or polyester. Although the plurality of lines 301S, 302S, 304S, and 305S are disposed in the identical conductor layer L11, two adjacent lines of the plurality of lines may slightly deviate from each other in a thickness direction Z. Similarly, although the plurality of lines 300G, 303S, and 306S are disposed in the identical conductor layer L12, two adjacent lines of the plurality of lines may slightly deviate from each other in the thickness direction Z. That is, when two adjacent lines deviate from each other, the allowable range of deviation is below the deviation in which the lower surface of one line is flush with the upper surface of the other line in the thickness direction Z.

As illustrated in FIG. 10A, one end of the flexible wiring board 103B1 in the wiring direction X is attached to the connector 112B1, and the other end of the flexible wiring board 103B1 in the wiring direction X is attached to the connector 122B1. That is, in the present embodiment, the one end and the other end of the flexible wiring board 103B1 in the wiring direction X serve as electrodes, and when the electrodes of the flexible wiring board 103B1 contact electrodes of the connectors 112B1 and 122B1, the electrodes of the flexible wiring board 103B1 are electrically connected to the electrodes of the connectors 112B1 and 122B1. In addition, one end of the flexible wiring board 103B2 in the wiring direction X is attached to the connector 112B2, and the other end of the flexible wiring board 103B2 in the wiring direction X is attached to the connector 122B2. That is, in the present embodiment, the one end and the other end of the flexible wiring board 103B2 in the wiring direction X serve as electrodes, and when the electrodes of the flexible wiring board 103B2 contact electrodes of the connectors 112B2 and 122B2, the electrodes of the flexible wiring board 103B2 are electrically connected to the electrodes of the connectors 112B2 and 122B2. In the above-described configuration, when the semiconductor devices 111 and 121 are electrically connected with each other via the printed wiring board 110B, the flexible wiring boards 103B1 and 103B2, and the printed wiring board 120B, the semiconductor devices 111 and 121 can communicate with each other.

Here, the configuration in which the flexible wiring boards 103B1 and 103B2 are electrically connected with the printed wiring boards 110B and 120B is not limited to the above-described configuration. For example, one ends of the flexible wiring boards 103B1 and 103B2 in the wiring direction X may have connectors, and the connectors may be attached to the connectors 112B1 and 112B2 of the printed wiring board 110B. Similarly, the other ends of the flexible wiring boards 103B1 and 103B2 in the wiring direction X may have connectors, and the connectors may be attached to the connectors 122B1 and 122B2 of the printed wiring board 120B. In another case, electrodes may be formed on the printed wiring boards 110B and 120B and the flexible wiring boards 103B1 and 103B2, and the printed wiring boards 110B and 120B and the flexible wiring boards 103B1 and 103B2 may be connected with each other without connectors.

As illustrated in FIG. 10B, the signal line 301S and the signal line 302S are disposed adjacent to each other in the width direction Y. In addition, the ground line 300G is disposed between the signal line 301S and the signal line 303S. Here, the width direction Y is a lateral direction of the flexible wiring boards 103B1 and 103B2. In other words, the width direction Y is a direction orthogonal to the longitudinal direction of the ground line 300G. The signal line 302S, the signal line 301S, the ground line 300G, and the signal line 303S are disposed in this order, in the direction orthogonal to the longitudinal direction of the ground line 300G.

The ground line 300G is electrically connected to grounded conductor patterns of the printed wiring boards 110B and 120B. Although not illustrated, a ground terminal of the semiconductor device 111 is electrically connected to the grounded conductor pattern of the printed wiring board 110B. Similarly, a ground terminal of the semiconductor device 121 is electrically connected to the grounded conductor pattern of the printed wiring board 120B.

The signal line 301S and the ground line 300G are disposed adjacent to each other in the width direction Y. The ground line 300G and the signal line 303S are disposed adjacent to each other in the width direction Y. The signal line 302S and the signal line 304S are disposed adjacent to each other in the width direction Y. The signal line 303S and the signal line 306S are disposed adjacent to each other in the width direction Y. That is, in the present embodiment, the lines 305S, 304S, 302S, 301S, 300G, 303S, and 306S are disposed in this order from the left side toward the right side of FIG. 10B, in the width direction Y.

Here, although the two differential pairs are used in the present embodiment to transmit differential signals, the number of differential pairs is not limited to two, and may be one or more. Similarly, although the two signal lines are used in the present embodiment to transmit single-ended signals, the number of signal lines through which the single-ended signals are transmitted is not limited to two, and may be one or more.

In the present embodiment, the ground line 300G is disposed between the signal line 301S and the signal line 303S. With this arrangement, although the signal lines 301S and 303S are disposed in the separate flexible wiring boards and separated from each other, the ground line 300G can produce the shield effect that reduces the crosstalk from the signal line 303S to the differential pair 311S, in particular, from the signal line 303S to the signal line 301S. As a result, high quality of the differential signals can be kept.

The distance D2 between the signal line 301S and the ground line 300G is larger than the distance D1 between the signal line 301S and the signal line 302S (D2>D1). With this arrangement, the electromagnetic coupling between the signal line 301S and the ground line 300G is weaker than the electromagnetic coupling between the signal line 301S and the signal line 302S. Thus, the electromagnetic interference between the signal line 301S of the differential pair 311S and the ground line 300G, that is, the crosstalk can be reduced. As a result, high quality of the differential signals can be kept.

In a case where a plurality of differential pairs are formed, a distance between adjacent differential pairs is preferably larger than the distance D1. In the present embodiment, since the two differential pairs 311S and 312S are formed, the distance D3 between the two differential pairs is preferably larger than the distance D1. Thus, the electromagnetic interference between the differential pairs 311S and 312S, that is, the crosstalk can be reduced. As a result, high quality of the differential signals can be kept.

Fourth Embodiment

Figure 11A:
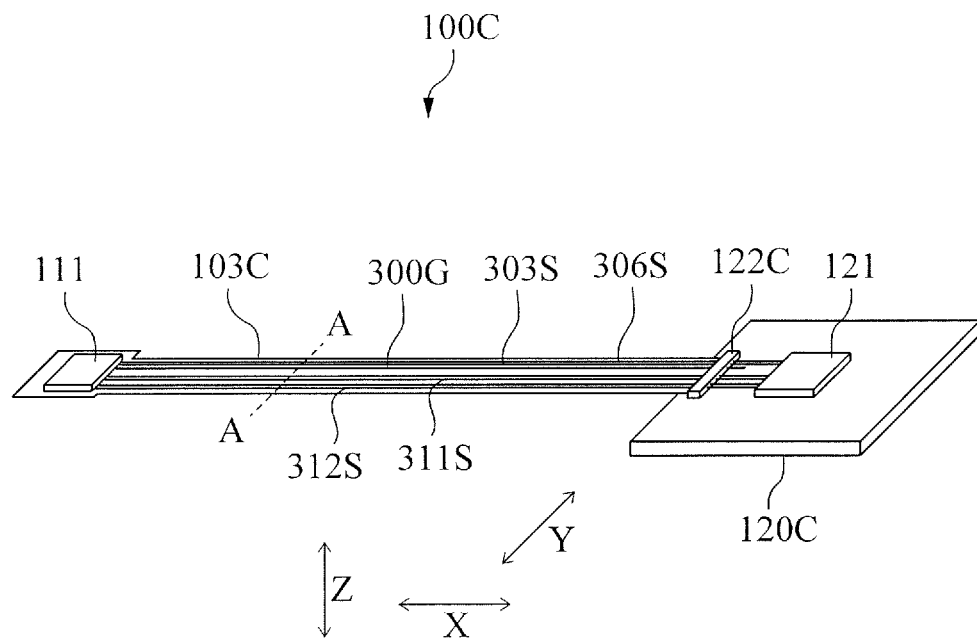
FIG. 11A is a diagram illustrating an image pickup unit that is one example of transmission circuits of a fourth embodiment.

Next, a transmission circuit of a fourth embodiment will be described. FIG. 11A is a diagram illustrating an image pickup unit 100C that is one example of transmission circuits of the fourth embodiment. In the fourth embodiment, the image pickup unit 100C is used in the digital camera 600, in place of the image pickup unit 100. The digital camera 600 described in the first embodiment is one example of electronic devices. In the fourth embodiment, a component identical to a component of the first embodiment is given an identical symbol, and the description thereof will be omitted.

As in the first embodiment, the image pickup unit 100C illustrated in FIG. 11A includes a semiconductor device 111 that is a first semiconductor device, a semiconductor device 121 that is a second semiconductor device, a printed wiring board 120C, and a flexible wiring board 103C. The flexible wiring board 103C allows the weight of the wiring structure to be lower than the weight of a wiring structure including coaxial cables. The semiconductor device 111 is mounted on the flexible wiring board 103C, and the semiconductor device 121 is mounted on the printed wiring board 120C. In addition, a connector 122C is mounted on the printed wiring board 120C. The connector 122C connects lines of the flexible wiring boards 103C and conductors formed on the printed wiring board 120C. The lines of the flexible wiring boards 103C are electrically connected to the semiconductor device 121 via the connector 122C. Thus, the semiconductor devices 111 and 121 are connected with each other so that they can communicate with each other.

Figure 11B:
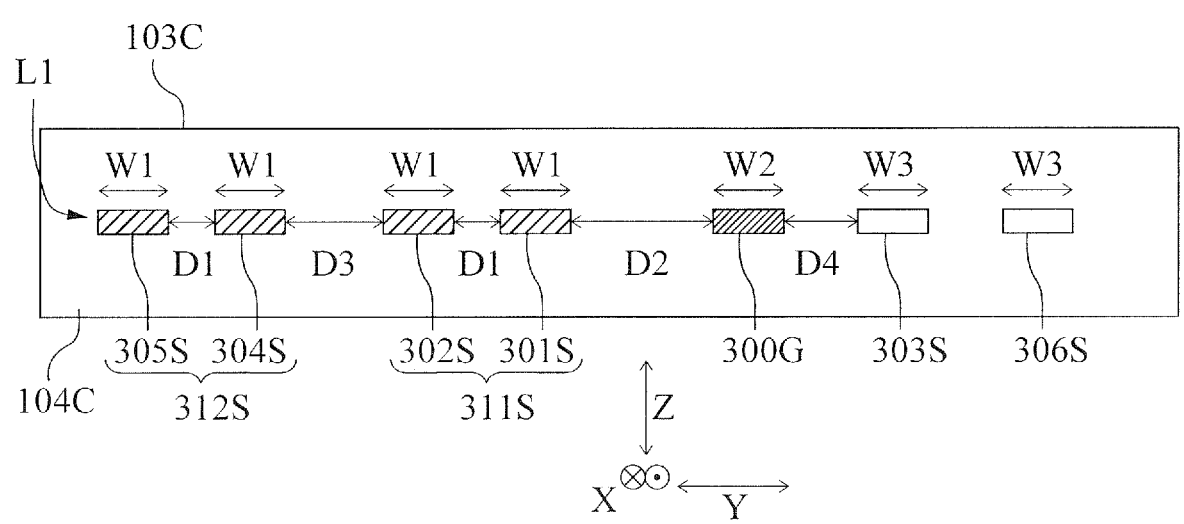
FIG. 11B is a cross-sectional view of a flexible wiring board of the fourth embodiment.

FIG. 11B is a cross-sectional view of the flexible wiring board 103C, taken along a line A-A. As illustrated in FIG. 11B, the flexible wiring board 103C is a single-layer substrate having a single conductor layer. Thus, the flexible wiring board 103C is made thinner and highly flexible. Consequently, the flexible wiring boards 103C can be easily arranged in the housing 611 (FIG. 1), allowing the digital camera to be thinner and lightened. The flexible wiring board 103C includes a plurality of lines 300G, 301S, 302S, 303S, 304S, 305S, and 306S, which are the same as those of the first embodiment. The lines are disposed in an identical conductor layer L1, with adjacent lines separated from each other in a width direction Y; and extend in a wiring direction X orthogonal to the width direction Y. The lines 300G, 301S, 302S, 303S, 304S, 305S, and 306S are conductor patterns disposed in the conductor layer L1. The material of the lines 300G, 301S, 302S, 303S, 304S, 305S, and 306S may be copper. The flexible wiring board 103C includes a dielectric 104C that holds the lines 300G, 301S, 302S, 303S, 304S, 305S, and 306S. The material of the dielectric 104C may be polyimide or polyester. Although the plurality of lines 300G, 301S, 302S, 303S, 304S, 305S, and 306S are disposed in the identical conductor layer L1, two adjacent lines of the plurality of lines may slightly deviate from each other in a thickness direction Z. That is, when two adjacent lines deviate from each other, the allowable range of deviation is below the deviation in which the lower surface of one line is flush with the upper surface of the other line in the thickness direction Z.

The flexible wiring board 103C includes a differential pair 311S, which includes the signal line 301S and the signal line 302S used for transmitting differential signals. The signal line 301S is a first signal line, and the signal line 302S is a second signal line. The flexible wiring board 103C also includes a signal line 303S, which is a third signal line used for transmitting a single-ended signal. The flexible wiring board 103C also includes the differential pair 312S, which includes the signal line 304S and the signal line 305S used for transmitting differential signals. The signal line 304S is a fourth signal line, and the signal line 305S is a fifth signal line. The flexible wiring board 103C also includes the ground line 300G, and the signal line 306S used for transmitting a single-ended signal.

As illustrated in FIG. 11A, one ends of the lines of the flexible wiring board 103C in the wiring direction X are joined with the semiconductor device 111 via solder or the like, and the other ends of the lines of the flexible wiring board 103C in the wiring direction X serve as electrodes. When the electrodes of the lines are attached to the connector 122C, the semiconductor devices 111 and 121 are electrically connected with each other, so that the semiconductor devices 111 and 121 can communicate with each other via the flexible wiring board 103C and the printed wiring board 120C.

Here, the configuration in which the flexible wiring board 103C is connected with the printed wiring board 120C is not limited to the above-described configuration. For example, one ends of the flexible wiring boards 103C may have a connector, and the connector may be attached to the connector 122C of the printed wiring board 120C. In another case, electrodes may be formed on the printed wiring board 120C and the flexible wiring board 103C, and the printed wiring board 120C and the flexible wiring boards 103C may be connected with each other without connectors.

As illustrated in FIG. 11B, the signal line 301S and the signal line 302S are disposed adjacent to each other in the width direction Y. In addition, the ground line 300G is disposed between the signal line 301S and the signal line 303S.

The ground line 300G is electrically connected to a grounded conductor pattern of the printed wiring board 120C. Although not illustrated, a ground terminal of the semiconductor device 121 is electrically connected to the grounded conductor pattern of the printed wiring board 120C.

The signal line 301S and the ground line 300G are disposed adjacent to each other in the width direction Y. The ground line 300G and the signal line 303S are disposed adjacent to each other in the width direction Y. The signal line 302S and the signal line 304S are disposed adjacent to each other in the width direction Y. The signal line 303S and the signal line 306S are disposed adjacent to each other in the width direction Y. That is, in the present embodiment, the lines 305S, 304S, 302S, 301S, 300G, 303S, and 306S are disposed in this order from the left side toward the right side of FIG. 11B, in the width direction Y.

Here, although the two differential pairs are used in the present embodiment to transmit differential signals, the number of differential pairs is not limited to two, and may be one or more. Similarly, although the two signal lines are used in the present embodiment to transmit single-ended signals, the number of signal lines through which the single-ended signals are transmitted is not limited to two, and may be one or more.

In the present embodiment, the ground line 300G is disposed between the signal line 301S and the signal line 303S. With this arrangement, the ground line 300G can produce the shield effect that reduces the crosstalk from the signal line 303S to the differential pair 311S, in particular, from the signal line 303S to the signal line 301S. As a result, high quality of the differential signals can be kept.

The distance D2 between the signal line 301S and the ground line 300G is larger than the distance D1 between the signal line 301S and the signal line 302S (D2>D1). With this arrangement, the electromagnetic coupling between the signal line 301S and the ground line 300G is weaker than the electromagnetic coupling between the signal line 301S and the signal line 302S. Thus, the electromagnetic interference between the signal line 301S of the differential pair 311S and the ground line 300G, that is, the crosstalk can be reduced. As a result, high quality of the differential signals can be kept.

In a case where a plurality of differential pairs are formed, a distance between adjacent differential pairs is preferably larger than the distance D1. In the present embodiment, since the two differential pairs 311S and 312S are formed, the distance D3 between the two differential pairs is preferably larger than the distance D1. Thus, the electromagnetic interference between the differential pairs 311S and 312S, that is, the crosstalk can be reduced. As a result, high quality of the differential signals can be kept.

In the present embodiment, the semiconductor device 111 is mounted on the flexible wiring board 103C. The present disclosure, however, is not limited to this. For example, the semiconductor device 121 may be mounted on the flexible wiring board 103C, in place of the semiconductor device 111. In another case, both the semiconductor devices 111 and 121 may be mounted on the flexible wiring board 103C.

The present invention is not limited to the above-described embodiments, and can be modified within a technical spirit of the present invention. In addition, the effects described in the embodiments are merely examples of the most suitable effects produced by the present invention. Thus, the effects of the present invention are not limited to the effects described in the embodiments.

In the above-described embodiments, it is preferable that each of the flexible wiring boards is a single-layer substrate for making the flexible wiring board thinner. The present disclosure, however, is not limited to this. For example, the present invention is also applicable to a flexible wiring board having two or more layers. Also in this case, since shield layers of the flexible wiring board may not be formed, the number of layers can be reduced by the number of shield layers. As a result, the wiring structure can be made thinner.

In addition, in the above-described embodiments, the description has been made for the cases where the flexible wiring boards serve as a wiring structure between the two semiconductor devices. The present disclosure, however, is not limited to this. For example, the present invention may also be applied to a flexible flat cable. However, a flexible wiring board is preferable because the flexible wiring board is thinner and more flexible than the flexible flat cable.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-178130, filed Sep. 21, 2018, which is hereby incorporated by reference herein in its entirety.

What is claimed is:

1. A transmission circuit comprising:
a first semiconductor device configured to receive and/or send a differential signal and a single-ended signal, the differential signal being composed of a first signal and a second signal;
a second semiconductor device configured to receive and/or send the differential signal and the single-ended signal;
a first signal line configured to connect the first semiconductor device and the second semiconductor device and used to transmit the first signal;
a second signal line configured to connect the first semiconductor device and the second semiconductor device and used to transmit the second signal;
a third signal line configured to connect the first semiconductor device and the second semiconductor device and used to transmit the single-ended signal; and
a ground line,
wherein the first signal line, the second signal line, the third signal line, and the ground line are disposed in order of the second signal line, the first signal line, the ground line, and the third signal line, and
wherein a distance between the first signal line and the ground line is larger than a distance between the first signal line and the second signal line.

2. The transmission circuit according to claim 1, wherein the distance between the first signal line and the ground line is equal to or larger than two times the distance between the first signal line and the second signal line.

3. The transmission circuit according to claim 1, wherein the first signal line, the second signal line, the third signal line, and the ground line are formed in a flexible wiring board.

4. The transmission circuit according to claim 3, wherein the flexible wiring board is a single-layer substrate having a single conductor layer, and
wherein the first signal line, the second signal line, the third signal line, and the ground line are formed in the single conductor layer.

5. The transmission circuit according to claim 3, wherein the first semiconductor device and/or the second semiconductor device is mounted on the flexible wiring board.

6. The transmission circuit according to claim 3, wherein a slit is formed between the first signal line and the ground line in the flexible wiring board.

7. The transmission circuit according to claim 3, wherein a slit is formed between the third signal line and the ground line in the flexible wiring board.

8. The transmission circuit according to claim 3, wherein a length of the first signal line, the second signal line, and the ground line is equal to or larger than a value obtained through a following expression (1):

$$\frac{2C_o}{\sqrt{\varepsilon r} \cdot R} \quad (1)$$

where R [bps] is a transmission speed of the differential signal, εr is a relative dielectric constant of a dielectric of the flexible wiring board, and $C_O$ [m/s] is a light speed.

9. The transmission circuit according to claim 1, further comprising a fourth signal line and a fifth signal line used to transmit a second differential signal, the second differential signal being composed of a third signal and a fourth signal,
wherein the first signal line, the second signal line, the fourth signal line, and the fifth signal line are disposed in order of the fifth signal line, the fourth signal line, the second signal line, and the first signal line, and
wherein a distance between the second signal line and the fourth signal line is larger than the distance between the first signal line and the second signal line.

10. The transmission circuit according to claim 3, further comprising a fourth signal line and a fifth signal line used to transmit a second differential signal, the second differential signal being composed of a third signal and a fourth signal,
wherein the first signal line, the second signal line, the fourth signal line, and the fifth signal line are disposed in order of the fifth signal line, the fourth signal line, the second signal line, and the first signal line,
wherein a distance between the second signal line and the fourth signal line is larger than the distance between the first signal line and the second signal line, and
wherein the fourth signal line and the fifth signal line are formed in the flexible wiring board.

11. The transmission circuit according to claim 10, wherein a slit is formed between the second signal line and the fourth signal line in the flexible wiring board.

12. The transmission circuit according to claim 1,
wherein the first signal line and the second signal line are formed in a first flexible wiring board, and
wherein the third signal line is formed in a second flexible wiring board other than the first flexible wiring board.

13. The transmission circuit according to claim 1, wherein the first semiconductor device is an image pickup element, and
wherein the second semiconductor device is a processing circuit configured to process a signal transmitted from the image pickup element.

14. An electronic device comprising:
the transmission circuit according to claim 1; and
a housing configured to house the transmission circuit.

15. An image pickup device comprising:
the transmission circuit according to claim 13; and
a housing configured to house the transmission circuit and comprising an attachment-and-detachment portion to which a lens unit is detachably attached,
wherein the first semiconductor device is disposed in the housing, closer to the attachment-and-detachment portion than the second semiconductor device.

16. The transmission circuit according to claim 1, wherein the distance between the first signal line and the ground line is larger than the distance between the ground line and the third signal line.

17. A transmission circuit comprising:
a first semiconductor device configured to receive and/or send a first differential signal, a second differential signal and a single-ended signal, the first differential signal being composed of a first signal and a second signal, the second differential signal being composed of a third signal and a fourth signal;
a second semiconductor device configured to receive and/or send the first differential signal, the second differential signal and the single-ended signal;

a first signal line configured to connect the first semiconductor device and the second semiconductor device and used to transmit the first signal;

a second signal line configured to connect the first semiconductor device and the second semiconductor device and used to transmit the second signal;

a third signal line configured to connect the first semiconductor device and the second semiconductor device and used to transmit the single-ended signal a fourth signal line configured to connect the first semiconductor device and the second semiconductor device and used to transmit the third signal;

a fifth signal line configured to connect the first semiconductor device and the second semiconductor device and used to transmit the fourth signal; and a ground line, wherein the first signal line, the second signal line, the third signal line, the fourth signal line, the fifth signal line, and the ground line are disposed in order of the fifth signal line, the fourth signal line, the second signal line, the first signal line, the ground line, and the third signal line.

18. The transmission circuit according to claim 17, wherein the distance between the first signal line and the ground line is larger than the distance between the ground line and the third signal line.

19. The transmission circuit according to claim 17, wherein the first signal line, the second signal line, the third signal line, the fourth signal line, the fifth signal line, and the ground line are formed in a flexible wiring board.

20. An electronic device comprising:
the transmission circuit according to claim 17; and
a housing configured to house the transmission circuit.

* * * * *